United States Patent [19]
Meyer et al.

[11] Patent Number: 6,100,704
[45] Date of Patent: Aug. 8, 2000

[54] QUANTITATIVE MOBILITY SPECTRUM ANALYSIS OF MAGNETIC-FIELD DEPENDENT HALL AND RESISTIVITY DATA

[75] Inventors: Jerry R. Meyer, Catonsville; Igor Vurgaftman, Pikesville, both of Md.; David Redfern, Mandurah, Wash.; Jaroslav Antoszewski, Thornlie, Wash.; Lorenzo Faraone, Mt. Lawley, Wash.; Jeffrey R. Lindenmuth, Galena, Ohio

[73] Assignee: The United States of America as represented by the Secretary of the Navy, Washington, D.C.

[21] Appl. No.: 09/069,945

[22] Filed: Apr. 30, 1998

[51] Int. Cl.$^7$ ............................................ G01R 31/26
[52] U.S. Cl. ........................... 324/719; 324/251; 324/719
[58] Field of Search ............................... 324/719, 765, 324/251, 691; 438/17

[56] References Cited

U.S. PATENT DOCUMENTS

| | | |
|---|---|---|
| 4,087,745 | 5/1978 | Kennedy, Jr. et al. ............ 324/58 |
| 4,857,839 | 8/1989 | Look et al. ....................... 324/158 |
| 5,789,931 | 8/1998 | Meyer et al. ..................... 324/765 |

FOREIGN PATENT DOCUMENTS

4231392A1  3/1994  Germany ................. G01R 27/00

*Primary Examiner*—Charles Bowers
*Assistant Examiner*—Evan Pert
*Attorney, Agent, or Firm*—Barry A. Edelberg; John J. Karasek

[57] ABSTRACT

The present invention is a method for determining a carrier conductivity-carrier mobility spectrum for a semiconductor sample, having the steps of: exposing the semiconductor sample to a range K of discrete magnetic fields k=1,2, ... K; for each field obtaining a Hall coefficient $R_H$ and a resistivity $\rho$, and calculating from $R_H(B_k)$ and $\sigma(B_k)$ experimental conductivity tensor components $\sigma_{xx}^k(\exp)$ and $\sigma_{xy}^k(\exp)$, and slopes of these conductivity tensor components $\sigma'_{xx}{}^k(\exp)$ and $\sigma'_{xy}{}^k(\exp)$; selecting a trial carrier conductivity-carrier mobility spectrum $s_i$ corresponding to a plurality I of carrier mobilities $\mu_i$, i=1,2, ... I; for each $B_j$, using this trial carrier conductivity-carrier mobility spectrum to calculate conductivity tensor components $\sigma_{xx}{}^j$ and $\sigma_{xy}{}^j$, and slopes of the conductivity tensor components $\sigma'_{xx}{}^j$ and $\sigma'_{xy}{}^j$; for each $B_j$, calculating errors $\Delta_{xx}{}^j \equiv \sigma_{xx}{}^j(\exp) - \sigma_{xx}{}^j$, $\Delta_{xy}{}^j \equiv \sigma_{xy}{}^j(\exp) - \sigma_{xy}{}^j$, $\Delta'_{xx}{}^j(\exp) - \sigma'_{xx}{}^j$, and $\Delta'_{xy}{}^j \equiv \sigma'_{xy}{}^j(\exp) - \sigma'_{xy}{}^j$, and calculating therefrom a total weighted squared error $\chi_j{}^2$; for each $B_j$ and at least a subset of $\mu_i$, calculating an optimum change to said trial carrier conductivity-carrier mobility spectrum $\delta s_{ij}$, and calculating therefrom a modified total weighted squared error $\chi_{ij}{}^2$; for each $B_j$, determining a minimum carrier mobility point $\mu_{iminj}$ whose corresponding change $\delta s_{ij}$ that yields the lowest weighted squared error $\chi_{ij}{}^2$; for each $B_j$ and at least a subset of $\mu_i$, changing the carrier conductivity-carrier mobility spectrum by not more than $\delta s_{ij}$.

35 Claims, 7 Drawing Sheets

- · · · · · · · SYNTHETIC DATA SET
- — — — i - QMSA HOLE RESULTS
- ——— i - QMSA ELECTRON RESULTS

- ——— o - QMSA ELECTRON RESULTS
- — — — o - QMSA HOLE RESULTS

QUANTITATIVE MOBILITY SPECTRUM ANALYSIS OF MAGNETIC-FIELD DEPENDENT HALL AND RESISTIVITY DATA

BACKGROUND OF THE INVENTION

1. Field of the Invention

The present invention relates generally to modeling the concentrations and mobilities of electrons and holes in semiconductors, from Hall and resistivity data. More particularly, the invention relates to fully automated modeling that does not require making assumptions about the number of types of carriers in the semiconductor.

2. Description of the Related Art

Mixed-conduction effects (that is, conduction that is attributable to several types of electrons and holes) quite often have a strong influence on the magneto-transport properties of semiconductor materials, including bulk samples, thin films, quantum wells, and processed devices. Multiple species, due to majority and minority carriers in the active region, intentional n and p doping regions (as well as unintentional doping non-uniformities along the growth axis), localization in multiple active regions, carriers populating buffer layers and substrates, 2D populations at surfaces and interface layers, and carriers populating different conduction band minima or valence band maxima (e.g., $\Gamma$, X, and L valley electrons) all tend to contribute simultaneously to the conduction in real materials of interest to industrial characterization and process control, and to research investigations of novel materials and phenomena. Standard measurements of the resistivity and Hall coefficient at a single magnetic field are of limited use when applied to systems with prominent mixed-conduction, since they provide only averaged values of the carrier concentration and mobility, which are not necessarily representative of any of the individual species. Far more information becomes available if one performs the magneto-transport experiments as a function of magnetic field, because in principle one can then deconvolve the data to obtain densities and mobilities for each type of carrier present.

A representative sample exhibiting the Hall effect is shown in FIG. 1, with the coordinate axes labeled. Coordinate axes are used herein for illustration purposes. The motion of carriers in an isotropic sample exhibiting the Hall effect may be described by:

$$J_x = \sigma_{xx} E_x + \sigma_{xy} E_y$$

$$J_y = \sigma_{yx} E_x + \sigma_{yy} E_y \quad (1)$$

where J is the current density in the x or y direction, where $\sigma_{xx}$ is the diagonal conductivity, or the conductivity in the x direction where the electric field E is applied in the x direction, where $\sigma_{xy}$ is the Hall conductivity, or the conductivity in the y direction where the electric field is applied in the x direction and a magnetic field B is applied in the z direction, and where $E_x$ and $E_y$ are the x and y components of E. For isotropic materials $\sigma_{xx} = \sigma_{yy}$ and $\sigma_{yx} = -\sigma_{xy}$.

The experimental Hall coefficient $R_H$ and resistivity $\rho$ are related to the components of the conductivity tensor by the expressions $$\sigma_{xx}(B) = \frac{1}{\rho(B)[(R_H(B)B/\rho(B))^2 + 1]}$$

and $$\sigma_{xy}(B) = \frac{R_H(B)B}{\rho^2(B)[(R_H(B)B/\rho(B))^2 + 1]}.$$

For a sample containing more than one type of carrier, the conductivity tensor components can be expressed as a sum over the m species present within the multi-carrier system:

$$\sigma_{xx} = \sum_{i=1}^{m} \frac{n_i e \mu_i}{1 + \mu_i^2 B^2} \quad (2)$$

and $$\sigma_{xy} = \sum_{i=1}^{m} S_i \frac{n_i e \mu_i^2 B}{1 + \mu_i^2 B^2} \quad (3)$$

where B is the magnetic field applied along the z axis, $n_i$ and $\mu_i$ are the concentration and mobility of the ith carrier species, e is the per carrier charge of $1.6 \times 10^{-19}$ coulombs, and $S_i$ is the charge sign of the ith carrier species (+1 for holes and −1 for electrons). It is primarily the $(1+\mu_i^2 B^2)$ terms in the denominators which differentiate the contributions by the various carrier species. The contributions due to higher-mobility carriers are the first to be "quenched" as B is increased, i.e., a given species exerts far less influence on $R_H(B)$ and $\rho(B)$ once $\mu_i B \gg 1$. This phenomenon provides the field-dependent Hall data with their high degree of sensitivity to the individual mobilities.

Several techniques are known for analyzing magnetic field dependent Hall data to model carrier concentrations. The traditional technique for analyzing magnetic-field-dependent Hall data is the Multi-Carrier Fitting (MCF) procedure, whereby equations (2) and (3) above are employed to fit experimental data. In this method, $n_i$ and $\mu_i$ are the fitting parameters and the number of carriers m is typically between 1 and 5. A significant drawback of the MCF is its arbitrariness. One must not only make prior assumptions about the approximate densities and mobilities of the various electron and hole species, but a decision must also be made in advance with respect to how many carriers of each type of assume. Injudicious guesses can lead to misleading or ambiguous results, and the fit to the experimental Hall data is not unique. A second disadvantage is that since discrete "delta function" mobilities are assumed, the fit yields no information about the "linewidth" of each mobility feature.

In order to overcome these shortcomings, Beck and Anderson (W. A. Beck and J. R. Anderson, *J. Appl. Phys.* 62, 541 (1987)) (BA) proposed an approach known as the Mobility Spectrum Analysis, in which an envelope of the maximum conductivity is determined as a continuous function of mobility. Equations (2) and (3) are rewritten in integral form $$\sigma_{xx}(B) = \int_0^\infty d\mu \frac{\hat{s}^p(\mu) + \hat{s}^n(\mu)}{1+\mu^2 B^2} \quad (4)$$

and $$\sigma_{xy}(B) = \int_{-\infty}^\infty d\mu \frac{[\hat{s}^p(\mu) - \hat{s}^n(\mu)]\mu B}{1+\mu^2 B^2}, \quad (5)$$

where $\hat{s}^p$ and $\hat{s}^n$ are the hole and electron conductivity density functions (i.e., the conductivity associated with a concentration of carriers at each mobility, also referred to herein as the mobility spectra). These are given by:

$$\hat{s}^p(\mu) = \hat{p}(\mu)e\mu,$$

$$\hat{s}^n(\mu) = \hat{n}(\mu)e\mu \quad (6)$$

where $\hat{p}(\mu)$ and $\hat{n}(n)$ are the hole and electron density functions (i.e., the concentration of carriers at each mobility). However, while the goal is to find $\hat{s}^p(\mu)$ and $\hat{s}^n(\mu)$, these are not uniquely defined by the measured $\sigma_{xx}(B)$ and $\sigma_{xy}(B)$. Given values for the conductivity tensor at N different magnetic fields define a 2N-dimensional space which has, at most, 2N independent basis vectors. Since equations (4) and (5) represent an expansion of the data in terms of an infinite basis, the expansion cannot be unique. Using a rather complex mathematical formalism, BA instead obtained unique envelopes $\hat{s}_{BA}^n(\mu)$ and $\hat{s}_{BA}^p(\mu)$ which represent physical δ-like amplitudes at $\mu$. While this is not as valuable as finding unique $\hat{s}^n(\mu)$ and $\hat{s}^p(\mu)$, it is still useful in that the most prominent carrier species may usually be identified from the peaks in the envelope spectrum. A major advantage of the mobility spectrum analysis over the MCF is that it is non-arbitrary, i.e., no prior assumptions are required. It is also computer automated, and provides a visually meaningful output format. However, the significant disadvantage is that the information obtained is primarily qualitative rather than quantitative, since one does not actually obtain a fit to the experimental Hall and resistivity data.

In 1988, Meyer et al. (J. R. Meyer, C. A. Hoffman, F. J. Bartoli, D. J. Arnold, S. Sivananthan, and J. P. Faurie, *Semicond. Sci. Technol.* 8, 805 (1993); C. A. Hoffman, J. R. Meyer, F. J. Bartoli, J. W. Han, J. W. Cook, Jr., and J. F. Schetzina, *Phys, Rev. B* 40, 3867 (1989)) developed a Hybrid Mixed Conduction Analysis (HMCA), which was extensively tested between 1988 and 1994. In that method, the BA mobility spectrum is used to determine the number of carrier species and roughly estimate their densities and mobilities, and the MCF is then used to obtain a final quantitative fit. However, a degree of arbitrariness is still present in making decisions based on the BA spectra, the multi-carrier fits do not always converge (e.g., the "best" fit may be obtained with one of the species having a density approaching infinity and a mobility approaching zero), and again one obtains no linewidth information, since the results are expressed only in terms of a small number of species with discrete mobilities. These difficulties effectively preclude full computer automation of some stages of the procedure. Brugger and Koser (H. Brugger and H. Koser, *III–V Reviews* 8, 41 (1995)) have more recently discussed a similar approach, which suffers from the same limitations.

In 1991–92, Dziuba and Gorska (Z. Dziuba and M. Gorska, *J. Phys. III France* 2, 99 (1992); Z. Dziuba, *Acta Physica Polonica A* 80, 827 (1991)) (DG) discussed a technique that was more ambitious than that of BA, namely to quantitatively derive the actual mobility distribution instead of just an upper-bound envelope. In their approach, the integrals appearing in the conductivity tensor expression of Eqs. (4) and (5) are approximated by sums of the partial contributions by carriers having a grid of discrete mobilities.

$$\sigma_{xx}(B_j) = \sum_{i=1}^N \frac{s^p(\mu_i) + s^n(\mu_i)}{1+\mu_i^2 B_j^2} \quad (7)$$

and $$\sigma_{xy}(B_j) = \sum_{i=1}^N \frac{[s^p(\mu_i) - s^n(\mu_i)]\mu_i B_j}{1+\mu_i^2 B_j^2} \quad (8)$$

where $s^p(\mu_i)$ and $s^n(\mu_i)$ are hole and electron conductivities associated with the discrete mobility grid point $\mu_i$. The parameter N defines both the number of points i in the final mobility spectrum and the number of magnetic fields j at which pseudo-data points $\sigma_{xx}(B_j)$ and $\sigma_{xy}(B_j)$, (which are denoted in what follows $\sigma_{xx}^j(\exp)$ and $\sigma_{xy}^j(\exp)$) are satisfied by the model. Interpolation is used to obtain the pseudo-data points from the actual experimental data, $\sigma_{xx}^{exp}$ and $\sigma_{xy}^{exp}$, which are usually measured at a much smaller number of fields $B_k$. Using an initial trial spectrum, DG solved the set of equations (7) and (8) using the Jacobi iterative procedure, in which the transformation matrix elements $1/(1+\mu_i^2 B_i^2)$ and $\mu_i B_i/(1+\mu_i^2 B_i^2)$ are simplified because of the specific choice of mobility points ($\mu_i = 1/B_i$) in the $s^p(\mu_i)$ and $s^n(\mu_i)$ spectra. An important consequence of this choice of mobility points is that the mobility range is limited to $\mu_{min} \leq \mu \leq \mu_{max}$. Here $\mu_{min} = 1/B_{max}^{exp}$ and $\mu_{max} = 1/B_{min}^{exp}$, where $B_{max}^{exp}$ and $B_{min}^{exp}$ are the minimum and maximum experimental magnetic fields. The goal of the procedure is to find those 2N variables $s^p(\mu_i)$ and $s^n(\mu_i)$ which solve the 2N equations in the system represented by Eqs. (7) and (8). In general, "non-physical" negative values of $s^p(\mu_i)$ and $s^n(\mu_i)$ are obtained for some regions of the spectra.

The original version of the Quantitative Mobility Spectrum Analysis (U.S. Pat. No. 5,789,931) (o-QMSA), which was developed in 1994 and 1995, was the first fully automated algorithm to combine the quantitative accuracy of the conventional least-squares MCF result with a visually meaningful mobility spectrum output format. An important difference between o-QMSA and DG is that the number of variables in o-QMSA is significantly smaller than the number of quasi-data points. The objective of the o-QMSA algorithm was thus not to reproduce the data exactly, but to obtain a spectrum which best fits the data to the extent allowed by the constricted number of variables.

In one embodiment of o-QMSA, an iteration procedure analogous to that used by DG is employed, except that $s^n(\mu)$ and $s^p(\mu)$ are both constrained to be non-negative at all iteration steps, which corresponds to a requirement that no carriers can contribute negative conductivities. The key consequence is that by forcing $s^n(\mu_i) > 0$ and $s^p(\mu_i) > 0$, many of the "variables" are no longer varied in any given fit, and the 2N data points must be fit using considerably less than 2N parameters. Extensive testing confirmed that the imposition of this condition removes the inherent instability of the DG procedure.

The Gauss-Seidel iterative approach with Successive Over-relaxation was used to solve the conductivity tensor equations for $s^p$ and $s^n$. Coefficients $\omega_x$ and $\omega_y$ were employed to control the speed of convergence, with preferred values that minimize the net error in the fits being $\omega_x=0.03$ and $\omega_y=0.003$.

The o-QMSA approach was extensively tested on resistivity and Hall data as a function of magnetic field (typically 0–7 T) and temperature for diverse types of semiconductor samples. Although the advantages of the o-QMSA over all previous mixed-conduction techniques were clear, several drawbacks also came to light. First, although reasonable fits to the experimental conductivity tensor could nearly always be obtained, the error was often considerably larger than that obtained using the MCF. Secondly, when the procedure was extended to a large number of iterations, the spectra often tended to collapse to a collection of discrete delta-function-like features, i.e. the linewidth information in the Hall data could not reliably be extracted. Thirdly, peaks corresponding to low-mobility features (having $\mu < B_{max}^{-1}$) were generated by extrapolating the data to magnetic fields B more than an order of magnitude beyond the experimental range bounded by $B_{max}^{exp}$. This procedure yields surprisingly reasonable results, bit is of questionable validity. And finally, the o-QMSA approach tends to produce a large number of "ghost" peaks, i.e. unphysical low-density minority features that can rob carriers from the majority peaks and thereby distort the derived carrier concentrations.

SUMMARY OF THE INVENTION

Accordingly, it is an object of this invention to model Hall and resistivity data for a semiconductor sample, and to extract electron and hole densities and mobilities, in he format of a mobility spectrum.

It is a further object of this invention that the conductivity tensor components derived from this spectrum accurately reproduce experimentally derived conductivity tensor components as a function of magnetic field, with low net error.

It is a further object of this invention to perform such modeling without making assumptions for the number or type of carrier species in the semiconductor sample.

It is a further object of this invention to model the breadth of conductivity-mobility peaks for each carrier species in the semiconductor sample.

It is a further object of this invention to model the conductivity-mobility spectrum for the semiconductor sample while minimizing the occurrence of unphysical "ghost" peaks.

It is a further object of this invention to reliably model carrier species with low mobilities (mobilities less than the inverse of the maximum experimental magnetic field).

It is a further object of this invention to provide such a model having a unique solution for a given semiconductor sample and set of Hall and resistivity data for that semiconductor.

It is a further object of this invention to make a fully automated model, in that after Hall and resistivity data are input, no further decisions or judgments are required by the operator, for the model to produce a physically meaningful result.

These and additional objects of the invention are accomplished by the structures and processes hereinafter described.

An aspect of the present invention is a method for determining a carrier conductivity-carrier mobility spectrum for a semiconductor sample, having the steps of: exposing the semiconductor sample to a range K of discrete magnetic fields k=1,2, . . . K; for each field (or at least for several fields), obtaining a Hall coefficient $R_H$ and a resistivity $\rho$, and calculating from $R_H(B_k)$ and $\rho(B_k)$ experimental conductivity tensor components $\sigma_{xx}^k(\exp)$ and $\sigma_{xy}^k(\exp)$, and slopes of these conductivity tensor components $\sigma'_{xx}^k \exp)$ and $\sigma'_{xy}^k(\exp)$; optionally interpolating between data points and/or extrapolating beyond data points taken at actual magnetic fields to obtain a superset J of data points j=1,2, . . . J, for $\sigma_{xx}^j(\exp)$, $\sigma_{xy}^j(\exp)$, $\sigma'_{xx}^j(\exp)$ and $\sigma'_{xy}^j(\exp)$ including both real data points taken at actual magnetic fields $B_k$ and pseudo data points representing interpolations between these real points, at a finer grid of magnetic fields $B_j$ than the measured values; selecting a trial carrier conductivity-carrier mobility spectrum $s_i$ corresponding to a plurality I of carrier mobilities $\mu_i$, i=1,2, . . . I; for each $B_j$, using this trial carrier conductivity-carrier mobility spectrum to calculate conductivity tensor components $\sigma_{xx}^j$ and $\sigma_{xy}^j$, and slopes of the conductivity tensor components $\sigma'_{xx}^j$ and $\sigma'_{xy}^j$; for each $B_j$, calculating errors $\Delta_{xx}^j \equiv \sigma_{xx}^j(\exp)-\sigma_{xx}^j$, $\Delta_{xy}^j \equiv \sigma_{xy}^j(\exp)-\sigma_{xy}^j$, $\Delta'_{xx}^j \equiv \sigma'_{xx}^j(\exp)-\sigma'_{xx}^j$, and $\Delta'_{xy}^j(\exp)-\sigma'_{xy}^j$, and calculating therefrom a total weighted squared error $\chi_j^2$; for each $B_j$ and at least a subset of $\mu_i$, calculating an optimum change to said trial carrier conductivity-carrier mobility spectrum $\delta s_{ij}$, and calculating therefrom a modified total weighted squared error $\chi_{ij}^2$; for each $B_j$, determining a minimum carrier mobility point $\mu_{iminj}$ whose corresponding change $\delta s_{ij}$ that yields the lowest weighted squared error $\chi_{ij}^2$; for each $B_j$ and at least a subset of $\mu_i$, changing the carrier conductivity-carrier mobility spectrum by not more than $\delta s_{ij}$.

This method typically will be repeated, until some condition is satisfied.

This method typically will include spectral manipulations such as two-point swapping, three-point swapping, and elimination, described in further detail below, for reducing the weighted squared error while smoothing the spectrum.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Figure 1:
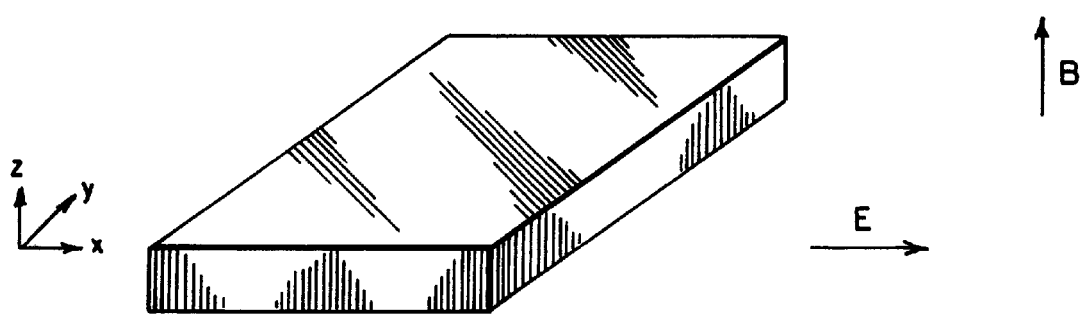
FIG. 1 is an elevation view of a semiconductor Hall sample in applied electric and magnetic fields, with coordinate axes labeled.

The present invention is an improved second-generation Quantitative Mobility Spectrum Analysis (referred to below as i-QMSA), which preserves the visual output format and full computer automation of o-QMSA while eliminating or suppressing its drawbacks. The i-QMSA procedure is based on a fundamentally new approach to analyzing Hall data and also incorporates several new techniques for manipulating the spectra so as to improve the fit while at the same time making them smoother and more physically reasonable.

The essence of the approach is to determine by a numerical calculation for each magnetic field pseudo-data point (i.e. $B_j$), the electron or hole conductivity that should be added to or subtracted from the spectrum in order to provide the greatest reduction in the error between the fit and the interpolated data at that magnetic field. The i-QMSA algorithm also differs from all previous mobility spectrum approaches in that it minimizes the errors not only in the magnitudes of the conductivity tensor components [$\sigma_{xx}$ (B) and $\sigma_{xy}$ (B)], but also in their slopes. This is found to be a valuable means for suppressing solutions that yield a good fit to the magnitudes, but are physically unreasonable because they contain significant high-frequency structure, which results in a rapidly varying slope. Separate procedures are also employed to simultaneously improve both the fits and the smoothness of the derived spectra through the "swapping" of carriers within a certain range of mobilities and "elimination" of mobility features that do not contribute to a net improvement of the fit. Unlike the previous iterative mobility spectrum approaches, which attempt a direct solution through numerical inversion of the matrix equations [Eqs. (7) and (8)] for the conductivity densities, in i-QMSA the goal is to optimize the fit through adding or subtracting carriers so as to reduce the errors at each individual magnetic field and by empirical manipulations of the mobility spectrum also based on the error reduction principle.

As in DG and o-QMSA, the i-QMSA procedure starts by assuming some initial trial spectrum, which typically may be taken from the BA mobility spectrum, but may also be taken from some other model. Generally, the results are not very sensitive to the choice of trial spectrum. At each iteration of the procedure one can define the current conductivity tensor components and their slopes at a pseudo-data point $B_j$ as implied by the currently available mobility spectra in the following manner:

$$\sigma_{xx}^j = \sum_i A_{xx}^{ij}[s^p(\mu_i) + s^n(\mu_i)] \tag{9}$$

where $A_{xx}^{ij} = 1/(1 + \mu_i^2 B_j^2)$, $$\sigma_{xy}^j = \sum_i A_{xy}^{ij}[s^p(\mu_i) - s^n(\mu_i)], \tag{10}$$

where $A_{xy}^{ij} = \mu_i B_j / (1 + \mu_i^2 B_j^2)$, $$\sigma_{xx}^{\prime j} = \sum_i A_{xx}^{\prime ij}[s^p(\mu_i) + s^n(\mu_i)], \tag{11}$$

where $A'^{ij}_{xx} = -2\mu_i^2 B_j^2 (A_{xx}^{ij})^2$, and $$\sigma_{xy}^{\prime j} = \sum_i A_{xy}^{\prime ij}[s^p(\mu_i) - s^n(\mu_i)] \tag{12}$$

where $A'^{ij}_{xy} = \mu_i B_j [1 - \mu_i^2 B_j^2](A_{xx}^{ij})^2$. At each iteration and for each magnetic field, one also calculates $\Delta_{xx}^j \equiv \sigma_{xx}^j(\exp) - \sigma_{xx}^j$, $\Delta_{xy}^j \equiv \sigma_{xy}^j(\exp) - \sigma_{xy}^j$, $\Delta'^j_{xx} \equiv \sigma'^j_{xx}(\exp) - \sigma'^j_{xx}$, and $\Delta'^j_{xy} \equiv \sigma'^j_{xy}(\exp) - \sigma'^j_{xy}$, which are the deviations of the experimental conductivity tensor components and normalized slopes from the conductivities computed from the current mobility spectrum using Eqs. (9)–(12). To simplify the succeeding expressions, the following equations include both electrons and holes in the summations in Eqs. (9)–(12), switching the sign of the $A_{xy}^{ij}$ and $A'^{ij}_{xy}$ coefficients for electrons. Also, either $s^p (\mu_i)$ and $s^n (\mu_i)$ as are referred to below as $s_i$.

The total weighted squared error at a given magnetic field is taken to be $$\chi_j^2 = \frac{F_{xx}^j(\Delta_{xx}^j)^2 + F_{xy}^j(\Delta_{xy}^j)^2 + F'^j_{xx}(\Delta'^j_{xx})^2 + F'^j_{xy}(\Delta'^j_{xy})^2}{J\sigma^2}, \tag{13}$$

where $F_{xx}^j$, $F_{xy}^j$, $F'^j_{xx}$, and $F'^j_{xy}$ are independently selected weighting factors, typically between 0 and 1, J is the number of pseudo data points, and $$\sigma^2 = \left[F_{xx}^j(\sigma_{xx}^j(\exp))^2 + F_{xy}^j(\sigma_{xy}^j(\exp))^2 + F'^j_{xx}(\sigma'^j_{xx}(\exp))^2 + F'^j_{xy}(\sigma'^j_{xy}(\exp))^2\right].$$

While $F_{xx}^j = F_{xy}^j = F'^j_{xx} = F'^j_{xy} = 1$ were employed in some but not all tests of the invention to date, more general dependencies may be advantageous.

If the conductivity for a given electron or hole mobility point is changed by an amount $\delta s_i$, then the modified error becomes $$\chi_{ij}^2 = \left[F_{xx}^j(\Delta_{xx}^j - A_{xx}^{ij}\delta s_i)^2 + F_{xy}^j(\Delta_{xy}^j - A_{xy}^{ij}\delta s_i)^2 + F'^j_{xx}(\Delta'^j_{xx} - A'^{ij}_{xx}\delta s_i)^2 + F'^j_{xy}(\Delta'^j_{xy} - A'^{ij}_{xy}\delta s_i)^2\right]/J\sigma^2. \tag{14}$$

The maximum improvement to the fit may be determined by taking the derivative $d\chi_{ij}^2/ds_i$, and setting it equal to zero. This yields the optimum conductivity change for magnetic field j and mobility i $$\delta s_{ij} = \frac{F_{xx}^j \Delta_{xx}^j A_{xx}^j + F_{xy}^j \Delta_{xy}^j A_{xy}^j + F'^j_{xx}\Delta'^j_{xx}A'^j_{xx} + F'^j_{xy}\Delta'^j_{xy}A'^j_{xy}}{F_{xx}^j(A_{xx}^{ij})^2 + F_{xy}^j(A_{xy}^{ij})^2 + F'^j_{xx}(A'^{ij}_{xx})^2 + F'^j_{xy}(A'^{ij}_{xy})^2}. \tag{15}$$

The calculated value of $\delta s_{ij}$ is next substituted back into Eq. (14) for all mobility points i or for some subset in order to determine the electron or hole mobility point $\mu_{iminj}$ that yields the greatest decrease in the error. In one embodiment of the invention, the conductivity density $s_{iminj}$ is then adjusted by $\delta s_{iminj}$ times some convergence parameter at the end of the given iteration as will be discussed below. However, in the preferred embodiment, this adjustment is made only if $\mu_{iminj}B_j$ falls in a range $(\mu B)_{min} \leq \mu_{iminj}B_j \leq (\mu B)_{max}$, where $(\mu B)_{min}$ and $(\mu B)_{max}$ are preselected parameters. The reason is that even though the error could in principle be improved through adjustment of $s_{iminj}$ at some $\mu_{iminj}B_j$ much different from unity, in that case the data at other magnetic fields closer to the range of $B \approx \mu_{iminj}^{-1}$ should be more sensitive to the need for such an adjustment. Although other values may ultimately prove to be more advantageous, most of the tests carried out to date have employed for the lower bound $(\mu B)_{min}$ the value of about 0.5 for $B_j <$ about 0.4 $B_{max}^{exp}$ and $(\mu B)_{min}$ of about $\mu_{min}B_j$, where $\mu_{min}$ is the lowest mobility in the spectrum, for $B_j >$ about 0.4 $B_{max}^{exp}$. The lower bound has been extended for high fields because this range of fields provides the greatest sensitivity to carriers with low mobilities ($\mu < B_{max}^{exp}$) for which there are no data satisfying the condition $B \approx \mu^{-1}$. Although other values may be advantageous, most tests carried out to data have employed the upper bound of $(\mu B)_{max} = 2.1 - 1.6/(1 + \mu_{max}^2 B_j^2)$, where $\mu_{max}$ is the highest mobility point in the spectrum (typically, $10^6$ cm$^2$/Vs).

In cases where this procedure would lead to the same mobility point being changed to correct errors at multiple magnetic fields in the same iteration, the modification is made only for that field with the highest contribution to the net error $$\chi^2 = \sum_j \chi_j^2. \tag{16}$$

The actual amount by which the spectrum is modified may be weighted by a convergence factor $\omega$ as well as other factors. In the preferred embodiment, the shift of $s_{iminj}$ is about $\Delta s_{iminj} = \omega f_c \chi_j^2 / \chi^2 \, \delta s_{iminj}$, and $\Delta s_{iminj} \leq \delta s_{iminj}$. Most of the tests to data have employed $\omega = 0.1$, although other values may be advantageous. The multiplication by the relative error $\chi_j^2/\chi^2$ ensures that the changes are scaled in accordance with their importance in obtaining a good fit. Although some embodiments of the invention employ $f_c = 1$, a non-unity value may be employed as a mechanism for smoothing the mobility spectrum. In the preferred embodiment $f_c$ is calculated as follows. For $\Delta s_{iminj} > 0$, the scaling factor $f_c = (s_{max}^- + s_{max}^+)/2 s_{iminj}$, where $s_{max}^-$ is the largest $s_i$ value in the mobility spectrum within a factor of 1.8 lower that $\mu_{iminj}$ and $s_{max}^+$ is the largest value within a factor of 1.8 higher than $\mu_{iminj}$. Here the maximum value is limited to $f_c \leq 10$. For $\Delta s_i < 0$, $f_c$ is the reciprocal of the same ratio with the minimum allowed value limited to $f_c \geq 0.1$. The inclusion of the $f_c$ factor makes it easier to smooth out either a local peak or a local valley in the mobility spectrum, but we emphasize that this occurs only if the procedure indicates that a given mobility point should be changed in the first place.

In some embodiments of the invention, changes are made only at $\mu_i = \mu_{iminj}$. However, in other embodiments changes are made over a range of $\mu_i$ whenever the maximum in the improvement $\Delta \chi_{ij}^2 \equiv \chi_j^2 - \chi_{ij}^2$ is broad. In the preferred embodiment, changes are made for points with $\Delta \chi_{ij}^2$ within about 30% of the maximum.

The preferred procedure as specified up to this point automatically selects the required carrier species corresponding to $\mu_{iminj}$ by determining $\chi_{ij}^2$ for i corresponding to both electrons and holes. However, if $\mu_{iminj}$ falls in either of the ranges $\mu_{iminj}B_j < (\mu B)'_{min}$ or $\mu_{iminj}B_j > (\mu B)'_{max}$, it is assumed that the fit will be best improved by simultaneously adding or subtracting carriers of both types, with i fixed by the condition $\mu_i = B_j^{-1}$:

$$\delta s_{ij}^n = \Delta_{xx}^j - \Delta_{xy}^j, \tag{17}$$

$$\delta s_{ij}^p = \Delta_{xx}^j + \Delta_{xy}^j \tag{18}$$

In this range, the invention reverts to a procedure very similar to that of o-QMSA. In most tests to data, $(\mu B)'_{min} = (\mu B)_{min}/2$ and $(\mu B)'_{max} = 2(\mu B)_{max}$, although other values may be advantageous. In the preferred embodiment, no action is taken with regard to a given $B_j$ in a given iteration if $\mu_{iminj}$ falls in either of the ranges $(\mu B)_{min} < \mu_{iminj}B_j < (\mu B('_{min}$ or $(\mu B)'_{max} < \mu_{iminj}B_j < (\mu B)_{max}$.

The procedure is typically repeated, using the modified spectrum from one iteration as the trial spectrum for the subsequent iteration. In each iteration, the outlined procedure is repeated for all magnetic field pseudo-data points j. In the preferred embodiment, the requirement $s_i \geq 0$ is imposed at all stages of the analysis as in o-QMSA, although this is not an essential feature of the invention. Another non-essential feature contained in the preferred embodiment is that at the end of each iteration the net conductivity corresponding to the calculated mobility spectrum $$\sum_i s_i$$

is allowed to relax to $\sigma_{xx}^{exp}$ at B=0. This relaxation is accomplished by multiplying all or some subset of the conductivities in the spectrum by a constant relaxation rate $$\omega_r \left[ \sigma_{xx}^{exp}(B=0) - \sum_i s_i \right],$$

where the relaxation rate $\omega_r$ can be set by the user, and in some embodiments may be zero.

The number of iterations may be preset to a specific number, e.g. between about 1000 and 5000. Alternatively, a minimum and maximum number of iterations may be set, with the option of ending the run between the minimum and maximum number of runs if some condition is satisfied. Typically, a run will terminate if the accuracy is satisfactory, as measured by the value of $\chi_2$ dropping to some threshold level, or by $\chi_2$ stabilizing at some level ($\chi_2$ not changing by more than a given amount over a given number of iterations). In tests to data, a typical run consists of 2000 iterations. However, this value is adjustable and will be determined by such considerations as the degree of accuracy required. It is also possible that further refinements in the parameter set employed in the invention will allow equally good results to be obtained in fewer iterations.

In addition to the basic iteration procedure described above, the invention also includes several new empirical manipulation techniques, which help to produce better fits in combination with smoother mobility spectra that are more physically reasonable. These are found to be valuable in the preferred embodiment, but are not essential to the operation of the invention. Specifically, the invention incorporates (1) two-point swapping, (2) three-points swapping, and (3) elimination, which effectively function independently of one another, and may be used together or in any combination of one or more.

The essence of the "two-point swapping" technique is to determine whether the net $\chi_2$ can be reduced by transferring carriers from one given electron or hole mobility point to any other mobility point within a certain range around the original point. In the preferred embodiment, inter-type swapping between electron mobility points and hole mobility points is forbidden, although this is not a necessary feature of the invention. Also, in the preferred embodiment swapping is allowed only between mobility points within half an order of magnitude in each direction away from the initial mobility $\mu_i$, although wider or narrower ranges may be advantageous. To determine the optimum destination, a small transfer is contemplated (in one preferred embodiment $\Delta s_{swap}=0.1\ s_i$), and the revised net error $\chi_{mod}^2\ \mu_k$) is calculated for each possible final destination $\mu_k$ in the specified mobility range around $\mu_i$. In the preferred embodiment, swapping to a local peak (any mobility point whose density is higher than those of both adjacent points) is disallowed, although this condition may be relaxed in other embodiments. Another optional feature in the preferred embodiment is that the raising of local valleys and the leveling of local peaks are favored over other swaps by substituting for $\chi_{mod}^2$ the value $(\chi_{mod}^2-\chi^2)s_{ave}/s_k+\chi^2$, where $s_{ave}$ is the average value of the conductivity density within a factor of 3 of $\mu_k$, and the ratio is restricted to the range $0.2 \leq s_{ave}/s_k \leq 5$. Once the points involved in the two-point swap are determined, the optimum density to be swapped, which must fall in the range $0<\Delta s_{swap} \leq s_i$, is determined by finding the minimum in $\chi_{mod}^2$ as a function of $\Delta s_{swap}$. In the preferred embodiment, the two-point swapping is carried out only when the swapping results in smoothing the spectrum (the two points are brought closer to their average).

While the two-point swapping procedure is very effective in reducing $\chi^2$ and at the same time removing non-essential features from the mobility spectrum, the allowed class of possible swaps is naturally restricted. To circumvent this limitation, the invention also incorporates a "three-point swapping" procedure, which can contribute further significant improvements to the mobility spectra. In this procedure, any three neighboring points $s_2$, $s_2$, and $s_3$ can be modified to become $s_1+\Delta s/2$, $s_2-\Delta s$, and $s_3+\Delta s/2$, respectively, if the resulting net $\chi_2$ is found to be less than before the swap. In the preferred embodiment of the three-point swapping procedure, $\Delta s$ is fixed by postulating that the product of the conductivity at the modified outer points should be equal to the square of the conductivity at the modified central point (so that there will be a smooth geometric progression between the densities at the three points) and solving the resulting quadratic equation for $\Delta s$:

$$\Delta s = \frac{s_1/2 + 2s_2 + s_3/2 \pm \sqrt{(s_1/2 + 2s_2 + s_3/2)^2 - 3(s_2^2 - s_1 s_3)}}{2(s_2^2 - s_1 s_3)} \quad (19)$$

The plus or minus sign in Eq. (18) is selected by calculating the final error for both and performing the swap that gives the better fit. In the preferred embodiment, the three-point swapping is carried out only when all three points have nonzero magnitudes and if no new peaks in the spectrum are created by the swap. In the preferred embodiment, all points in the mobility spectrum are constrained to be positive definite at all times, although this is not a necessary feature of the invention.

Besides the swapping procedures, the invention also includes an "elimination" procedure. In this step, each point in the mobility spectrum with an appreciable value of the conductivity is tested to determine whether a reduction in its value by $\Delta s_i$ results in a decrease in the net $\chi^2$. In the preferred embodiment, $\Delta s_i=0.1\ s_i$, and the actual amount of reduction is calculated by taking 20% of the ratio of $\chi_2$ before the elimination to its derivative with respect to $\Delta s_i$.

In one preferred embodiment of the invention, the two-point swapping procedure is activated after the completion of each 100 iterations of the basic procedure, whenever the total number of iterations exceeds 300. The three-point swapping procedure is performed each 100 iterations, whenever the total number of iterations exceeds 150. However, since these frequencies are not necessarily optimized, other configurations may be preferable. It is often useful to repeat both the 2-point and 3-point swapping procedures I times at the end of the last iteration of a given run. In one preferred embodiment, I=50. These procedures may be generalized to construct alternative 2-point and 3-point swaps as well as to swaps involving 4 or more points.

Before discussing some sample applications of i-QMSA, it should be noted that the amplitudes of $s''(\mu_i)$ and $s^p(\mu_i)$ in the QMSA depend on the density of points used (20 points per decade being one preferred value). Thus, in order to obtain the total conductivity corresponding to the carrier represented by a particular peak, all of the amplitudes under the peak must be added together. The average mobility associated with that peak can also be calculated at the same time.

The Anisotropic Case

The method of the invention is useful for carriers with both isotropic and anisotropic mobilities. The partial conductivity for carriers with an anisotropic mobility does not necessarily satisfy the relationship $\sigma_{xx}=\sigma_{yy}$. The above discussion has been set out in terms of isotropic carriers, but the techniques are readily adaptable to materials with anisotropic carriers, and these techniques are also considered to be part of the invention. To model conduction with anisotropic carriers, the expressions for the conductivity tensor components in equations (7) and (8) above are modified, to wit:

$$\sigma_{xx}(B) = \sum_{i=1}^{N} n_i e \left[ \frac{C(\mu_{i1} + \mu_{i2})}{2(1 + \mu_{i1}\mu_{i2}B^2)} + \frac{(1-C\mu_{i1})}{1+\mu_{ij}^2 B^2} \right], \quad (20)$$

$$\sigma_{xy}(B) = \sum_{i=1}^{N} S_i n_i e \left[ \frac{C\mu_{i1}\mu_{i2}B}{1+\mu_{i1}\mu_{i2}B^2} + \frac{(1-C\mu_{i1})\mu_{ij}^2 B}{1+\mu_{ij}^2 B^2} \right], \quad (21)$$

where $\mu_{i1}$ and $\mu_{i2}$ are the distinct mobilities along two in-plane axes defining symmetry directions (in the following, $\mu_{i1} \geq \mu_{i2}$ for the sake of illustration—just as valid is $\mu_{i2} \geq \mu_{i1}$). The factor C, which weights the contributions of the different mobility symmetry axes, is ⅔ for many anisotropic cases of interest, such as X-valley and L-valley electrons in n-type indirect gap semiconductors such as Si, Ge, SiC, and AlAs. However, for some cases, C is about 1, e.g. for in-plane transport for Bi samples grown along the trigonal axis. The definition of other quantities is as above.

Again taking the sum over i to represent a fine grid of mobilities, we obtain the following expressions for the conductivity tensor components and their slopes [analogues to Eqs. (9) to (12) above]:

$$\sigma_{xx}(B_j) = \sum_i A_{xx}^{ij}[s^p(\mu_i) + s^n(\mu_i)] \quad (22)$$

where $$A^{ij}_{xx} = \frac{C(1+R_i)}{2(1+R_i\mu_i^2 B_j^2)} + \frac{1-C}{1+\mu_i^2 B_j^2},$$

$$\sigma_{xy}(B_j) = \sum_i A^{ij}_{xy}[s^p(\mu_i) - s^n(\mu_i)], \quad (23)$$

where $$A^{ij}_{xy} = \frac{CR_i\mu_i B_j}{1+R_i\mu_i^2 B_j^2} + \frac{(1-C)\mu_i B_j}{1+\mu_i^2 B_j^2},$$

$$\sigma'^j_{xx} = \sum_i A'^{ij}_{xx}[s^p(\mu_i) + s^n(\mu_i)], \quad (24)$$

where $$A'^{ij}_{xx} = \frac{-2CR_i\mu_i^2 B_j^2}{(1+R_i\mu_i^2 B_j^2)^2} + \frac{-(1-C)2\mu_i^2 B_j^2}{(1+\mu_i^2 B_j^2)^2},$$

and $$\sigma'^j_{xy} = \sum_i A'^{ij}_{xy}[s^p(\mu_i) - s^n(\mu_i)] \quad (25)$$

where $$A'^{ij}_{xy} = \frac{CR_i\mu_i B_j(1-R_i\mu_i^2 B_j^2)}{(1-R_i\mu_i^2 B_j^2)^2} + \frac{(1-C)\mu_i B_j(1-\mu_i^2 B_j^2)}{(1+R_i\mu_i^2 B_j^2)^2},$$

and where $R_i = \mu_{i2}/\mu_{i1}$ for either type of carrier, $R_n$ for electrons and $R_p$ for holes.

In the preferred embodiment of i-QMSA, one makes the additional assumption that $R_n$ and $R_p$ are constant. However, the algorithm may be modified to include the more general case, in which $R_n$ or $R_p$ or both vary as a function of mobility point in the spectrum. In general, $R_n \neq R_p$, and in many of the most common semiconductors, $R_p$ is about 1.

Substituting the foregoing expressions for the formulas for the conductivity tensor components and their slopes given for the isotropic case, the same procedure can be followed in deriving the mobility spectra with the exception of using $\mu B[1+C(\sqrt{R}-1)]$ wherever the $\mu B$ product occurs in upper and lower bounds, such as $(\mu B)_{min}$ and $(\mu B)_{max}$. In the preferred embodiment, the parameters $R_n$ and $R_p$ must be specified by the user, for example, on the basis of known properties of a given semiconductor. However, in some embodiments, $R_n$ and/or $R_p$ may be used as additional fitting parameters to obtain the lowest $\chi^2$.

In the o-QMSA-like branch requiring the adjustment of both electrons and holes, explicit expressions for $\delta s_i^n$ and $\delta s_i^p$ can be derived:

$$\delta s_i^n = \frac{\Delta^j_{xx} - a_{12}\delta s_i^p}{a_{11}}, \quad (26)$$

$$\delta s_i^p = \frac{\Delta^j_{xy} - (a_{12}/a_{11})\Delta^j_{xx}}{a_{22} - (a_{21}/a_{11})a_{12}}, \quad (27)$$

where $$a_{11} = \frac{C(1+R_n)}{4} + (1-C)\frac{R_n}{1+R_n},$$

$$a_{12} = \frac{C(1+R_p)}{4} + (1-C)\frac{R_p}{1+R_p},$$

$$a_{21} = \frac{-C\sqrt{R_n} + (1-C)2R_n/(1+R_n)}{2},$$

$$a_{22} = \frac{-C\sqrt{R_p} + (1-C)2R_p/(1+R_p)}{2}.$$

No other modifications are required in the basic algorithm as it was discussed for the isotropic case; moreover, the mobility spectrum manipulation procedures (swapping and elimination) are not altered.

Once the mobility spectra are computed, the modified expressions Eqs. (22) and (23) must be taken into account in deriving the average carrier mobilities and Hall factors for the various carrier species. In particular, the expression for the average mobility becomes:

$$\mu = \sum_i \frac{s_i}{en}\left[\frac{C}{2}(R_i - 1) + 1\right]. \quad (28)$$

However, the expression used to compute the integrated carrier density is unchanged:

$$n = \sum_i \frac{s_i}{e\mu_i}. \quad (29)$$

The i-QMSA algorithm with the modifications outlined above was tested through application to several anisotropic systems. First of all, it was verified that the anisotropic i-QMSA procedure can faithfully reproduce the features of multicarrier synthetic data sets by analogy to the testing of the isotropic procedure with synthetic data as discussed in the invention disclosure. In particular, excellent agreement (to within 1%) for both the carrier density and average mobility was obtained for a synthetic spectrum with a single electron feature. On the other hand, if isotropic conduction was incorrectly assumed for the same case, the electron feature was erroneously accompanied by a ghost hole with almost the same total density. Both the integrated electron density and average mobility were strongly distorted when isotropic conduction was assumed.

Determination of the Hall Factor

The mobility spectra obtained from i-QMSA can also be used to determine the Hall factor, which for a single-carrier system has the form $r_H = N/R_H e$, where N is the actual electron or hole density, and $R_H$ is the Hall coefficient at low magnetic fields ($\mu B \ll 1$). Ordinarily the Hall factor is very difficult to determine accurately unless the carrier concentration is accurately known independently of the Hall characterization. However, i-QMSA provides a means of determining $r_H$ from the field-dependent Hall data alone. The Hall factor for a single-carrier system tends to be related to the thermal (or nonuniformity) broadening of the mobility spectra. The latter is given by:

$$r_H \equiv \frac{\langle \tau^2 \rangle}{\langle \tau \rangle^2}, \tag{30}$$

where the averaged momentum relaxation time raised to a power s is defined as follows:

$$\langle \tau^s \rangle = \frac{\int_0^\infty dE D(E) f(E)[1 - f(E)] E \tau^s(E)}{\int_0^\infty dE D(E) f(E)[1 - f(E)] E}. \tag{31}$$

Here D(E) is the electron density of states as a function of energy, f(E) is the Fermi function, E is energy, and s is either 1 or 2. The thermal (nonuniformity) distribution of energies with different relaxation times will lead directly to an equivalent broadening of the derived mobility spectrum. The Hall factor can then be computed from the mobility spectrum in the following manner:

$$r_H = \frac{\langle \mu^2 \rangle}{\langle \mu \rangle^2} = \frac{\left( \sum_i \sigma_i \mu_i \right)}{\left( \sum_i \sigma_i \right)^2 / \left( \sum_i \sigma_i / \mu_i \right)}. \tag{32}$$

That the two definitions of $r_H$ are equivalent can be seen by defining the infinitesimal carrier density at each energy as:

$$dN = \frac{Nf(E)[1 - f(E)]D(E)E dE}{\int_0^\infty dE f(E)[1 - f(E)]D(E)E}, \tag{33}$$

where $N = \int_0^\infty dE D(E) f(E)$ is the total carrier density. Then the averaged power of the relaxation time can be written as $$\langle \tau^s \rangle = 1/N \int_0^\infty dE (dN/dE) \tau^s(E) \tag{34}$$

which is related to the averaged power of the mobility by the expression:

$$\langle \mu^s \rangle = e/m^* \langle \tau^s \rangle, \tag{35}$$

where m* is the effective mass.

For the case of anisotropic conduction, the net Hall factor is a product of the well-known correction related to anisotropy and the thermal (nonuniformity) term given by Eq. (32).

Having described the invention, the following examples are given to illustrate specific applications of the invention, including the best mode now known to perform the invention. These specific examples are not intended to limit the scope of the invention described in this application.

Isotropic Case Example

We illustrate the operation of the invention by using it to determine the electron and hole mobility spectra corresponding to several sets of data consisting of the conductivity tensor components as functions of magnetic field. Some of the data are actual measurements for real semiconductor samples, while others are "synthetic", i.e. generated by applying Eqs. (7) and (8) to some assumed spectrum. All of these examples take $B_{max}^{exp}=7T$.

Figure 2:
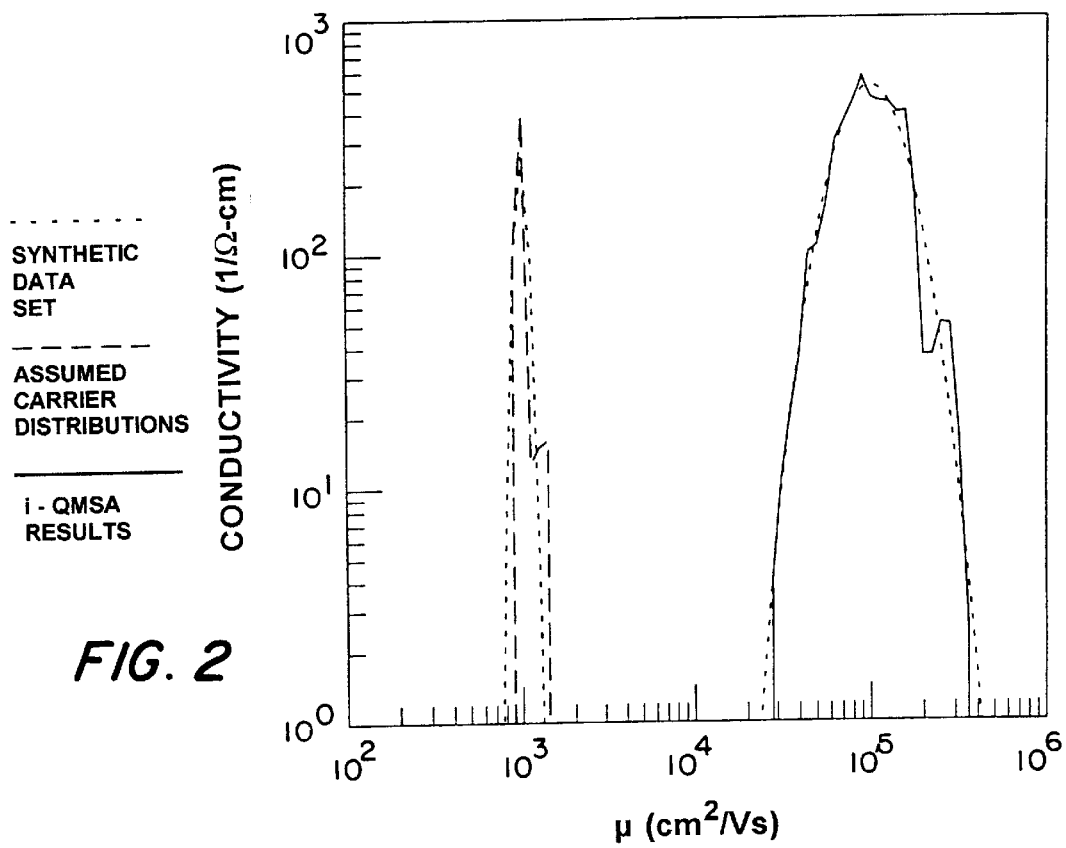
FIG. 2 is a plot of the results obtained from the present invention for a synthetic data set assuming one broad electron feature with a Gaussian profile and one narrow hole feature.
Figure 3:
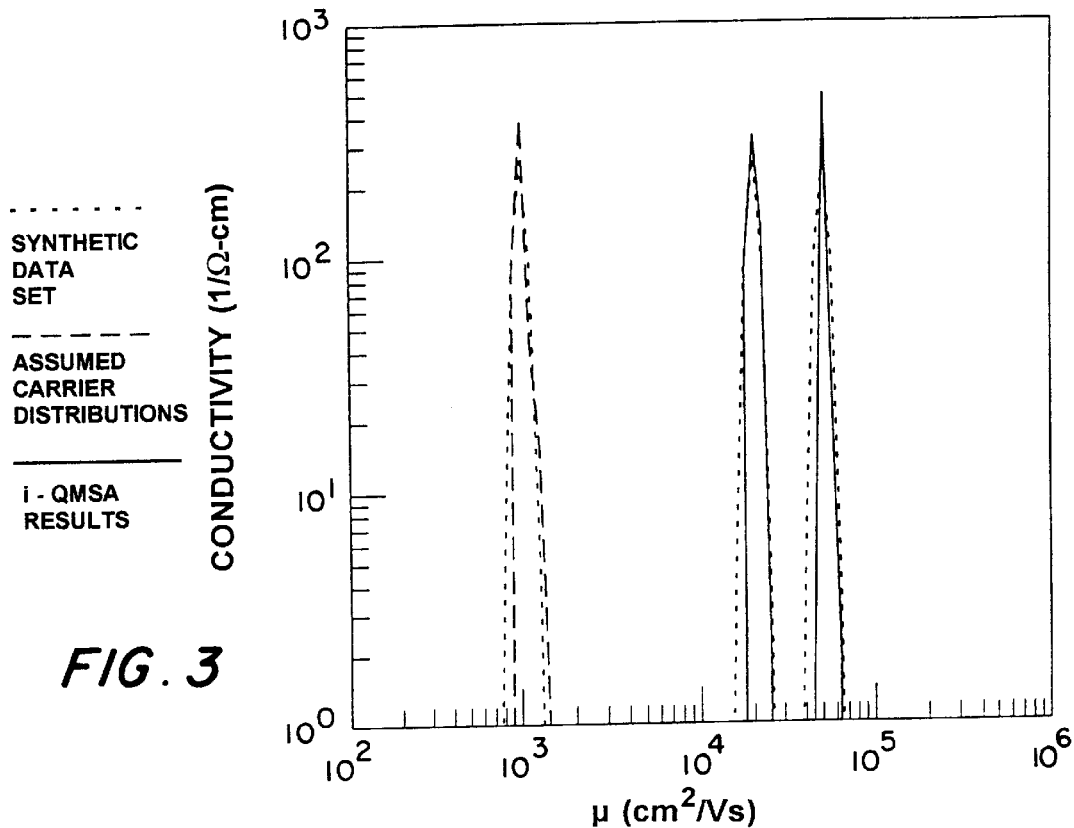
FIG. 3 is a plot of the results obtained from the present invention for a synthetic data set assuming two narrow electron peaks and one narrow hole feature.

FIG. 2 illustrates the results for a synthetic data set (dotted lines) obtained by assuming one broad electron feature with a Gaussian profile centered at $10^5$ cm$^2$/Vs and one narrow hole feature centered at 1000 cm$^2$/Vs. The assumed carrier distributions are shown by the dashed lines in the figure, while the results of the i-QMSA procedure are given by the solid lines. The invention not only reproduces the electron and hole densities and average mobilities to better than 1%, but it can be seen that it also quite accurately preserves the broadening information in the synthetic spectrum. Additional tests shown that this result is independent of the central position of the features for all mobilities between 1000 and $10^5$ cm$^2$/Vs and is also independent of the carrier type. FIG. 3, which is obtained by replacing the single broad electron feature with two narrow peaks at $2 \times 10^4$ cm$^2$/Vs, shows that the algorithm can nonetheless resolve even very closely spaced mobility peaks. In fact, extensive testing shows that the resolution remains excellent over the entire range from 1000 to $10^6$ cm$^2$/Vs. Some resolution is retained even for the range $\mu < B_{max}^{-1}$, which cannot even be assessed with some of the prior analysis techniques. It will be seen below that isolated narrow features can be very well reproduced for mobilities as low as 100 cm$^2$/Vs.

Figure 4:
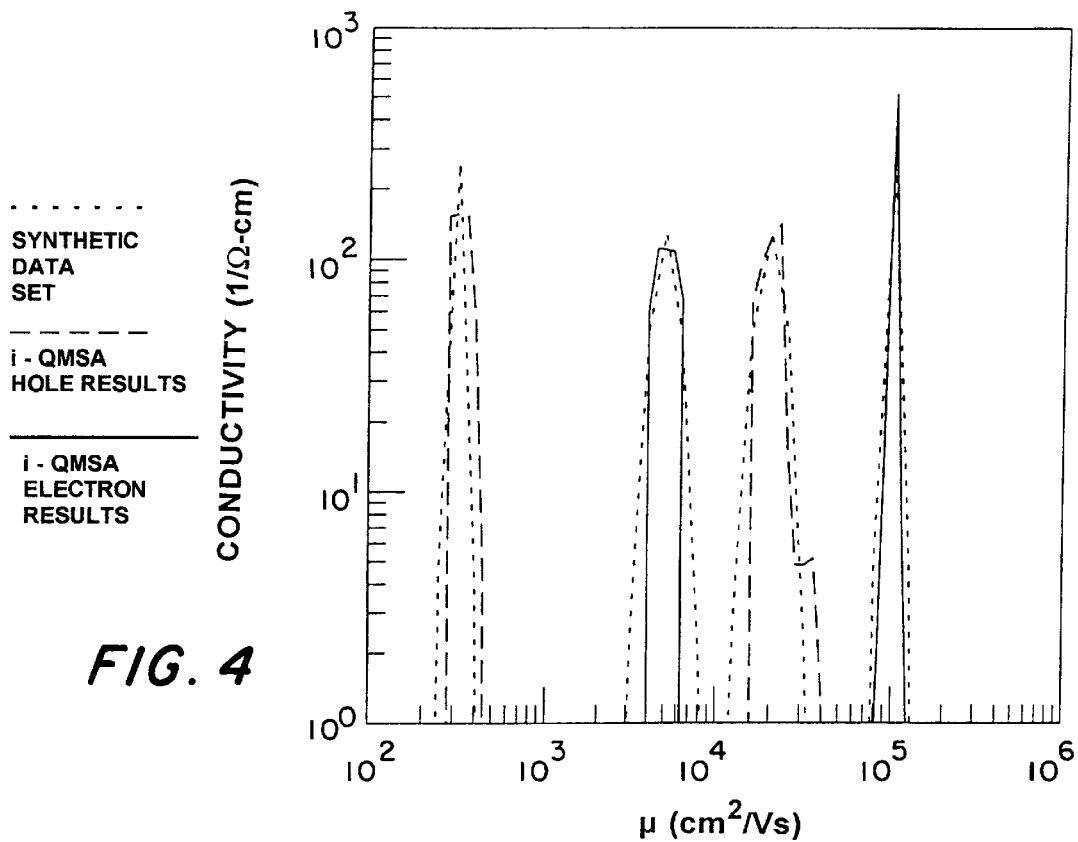
FIG. 4 is a plot of the results obtained from the present invention for a more complex synthetic data set composed of 2 electron and 2 hole features.

FIG. 4 shows the results of applying the invention to a more complex synthetic data set composed of 2 electron and 2 hole features. In this case, the functional dependence of $\sigma_{xy}(B)$ is very complicated, since its sign changes three times. Nevertheless, an excellent fit is obtained when the invention is applied, with an error as low as $\chi^2 = 5 \times 10^{-8}$. (While the i-QMSA spectra are derived by minimizing the weighted error of Eq. (13), in order to more validly compare with the results of other methods, the $\chi^2$'s reported in this section correspond to the accuracy of the fits to the magnitude of the conductivity tensor components alone, i.e. Eq. (13) evaluated with $F_{xx}^{ij}=F_{xy}^{ij}=0$.) As in all other simulations with synthetic data to date as well as in nearlyl all cases of real experimental data, little difference between the actual and fitted $\sigma_{xy}$ can be discerned visually if the two quantities are plotted on the same scale. Furthermore, in this example i-QMSA even correctly determines that the linewidths of the middle two features are slightly larger than those of the other two. Also, the position of the low-mobility peak at 316 cm$^2$/Vs (corresponding to $B=\mu^{-1}=32$ T≈5 $B_{max}^{exp}$) is reproduced to within 2%, and the carrier density to within 20%, whereas the corresponding BA spectrum does not even indicate the existence of a hole peak in this mobility range.

While application of the invention to synthetic data sets is quite useful as a means of evaluating the accuracy and reliability of the algorithm under conditions for which the "correct" spectrum is known, applications involving real data provide a better test of how i-QMSA performs in the presence of experimental noise and unavoidable systematic errors in the measurement of $\sigma_{xx}(B)$ and $\sigma_{xy}(B)$. Overall, the algorithm has been found to converge rapidly to a physically reasonable solution in all of the cases considered to date. Although the error tends to be somewhat larger than for synthetic data (especially in low-temperature cases where the data are distorted by pronounced Shubnikov-de Haas oscillations), the error is invariably much less for o-QMSA (typically by 1–2 orders of magnitude) and $\chi^2$ is usually better than that attainable from the MCF when a reasonable number of carrier species is assumed.

Figure 5:
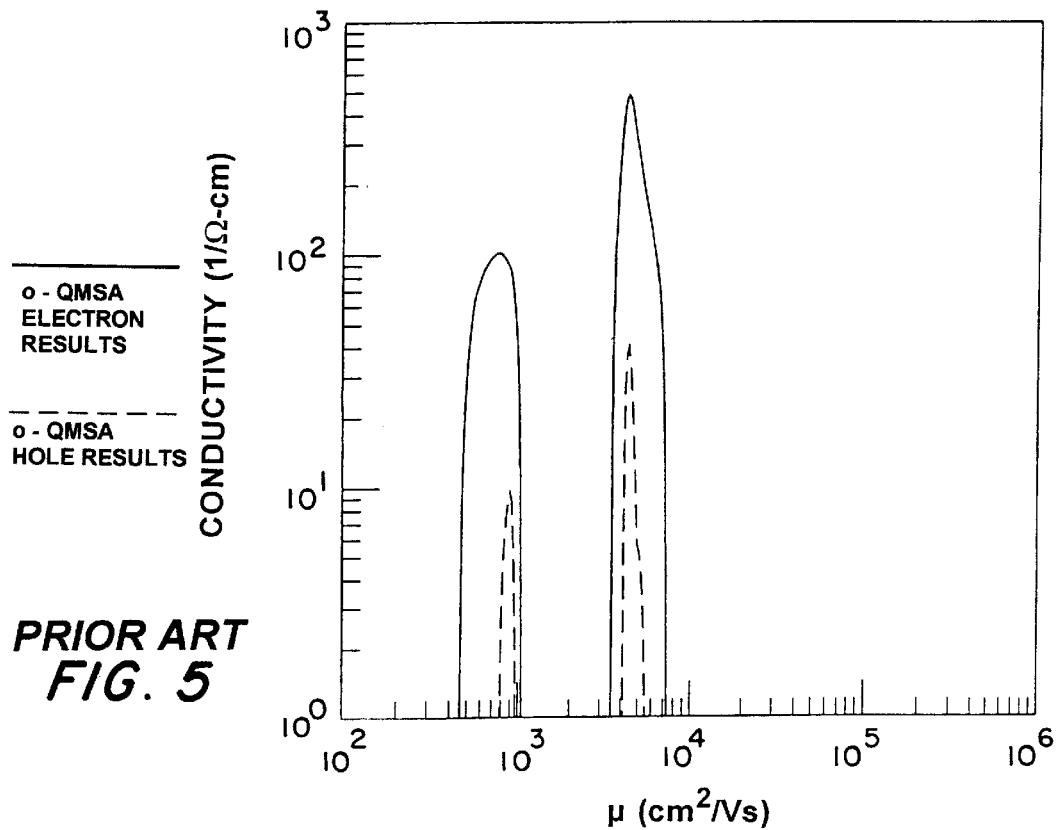
FIG. 5 (prior art) is a plot of the results obtained from the o-QMSA method, where electron peaks are indicated by the solid curves and hole peaks by the dashed curves.
Figure 6:
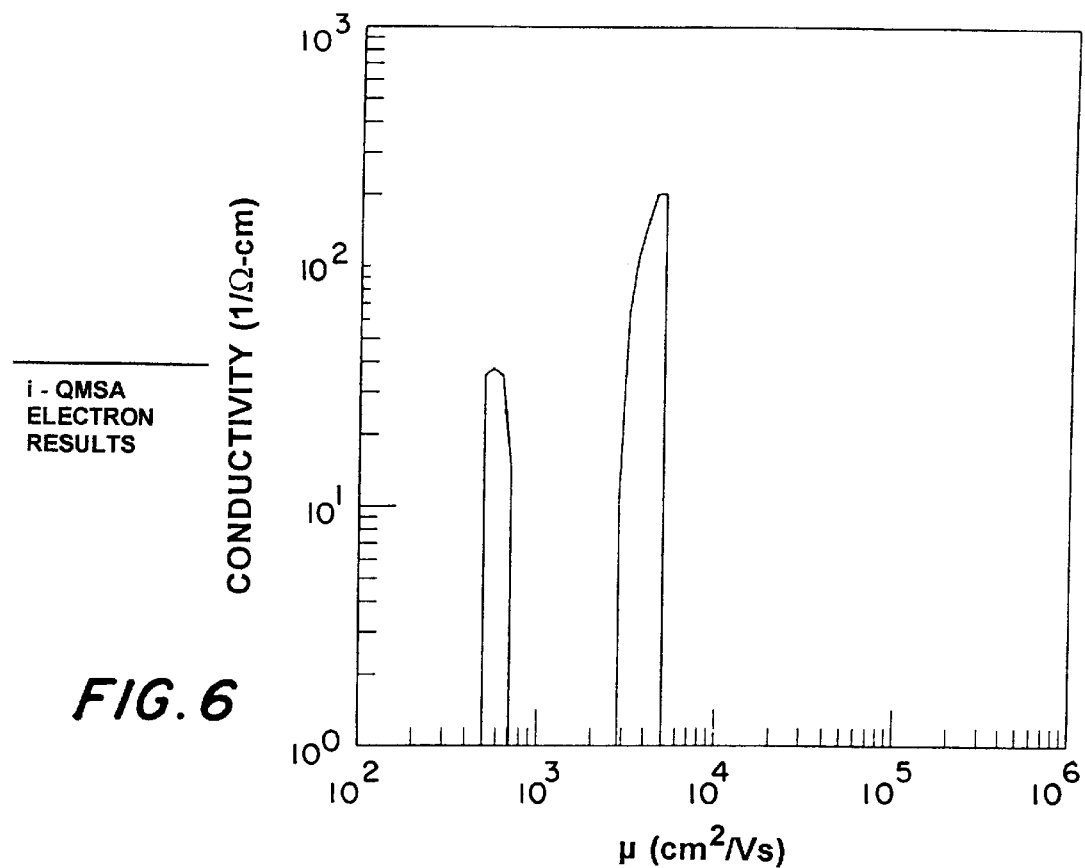
FIG. 6 is a plot of the results obtained from the present invention for the same synthetic data set as FIG. 5.

We next consider the results of applying the invention to the analysis of magnetic-field-dependent conductivity and Hall data at 296 K for a 150-Å thick InGaAs-InAlAs quantum well grown by molecular beam epitaxy (MBE). For comparison, FIG. 5 shows the o-QMSA spectra, where again electron peaks are indicated by the solid curves and hole peaks by the dashed curves. The two distinct electron peaks correspond to carriers in the doped quantum wells (integrated density of $N_{s1}=1.42\times10^{12}$ cm$^{-2}$, average mobility $\mu_1$=4600 cm$^2$/Vs) as well as electrons in a doped top cap layer for making contact to a gate ($N_{s2}=3.38\times10^{12}$ cm$^{-2}$, $\mu_2$=710 cm$^2$/Vs). The smaller hole peaks lying underneath both electron peaks are unphysical "ghost" artifacts, as becomes especially clear when the improved algorithm is applied. While the i-QMSA results in FIG. 6 again show two distinct electron peaks, the two hole ghosts are now entirely eliminated. The mobility spectrum of FIG. 6 has an error of $4\times10^{-6}$, which is more than two orders of magnitude better than the value $7.5\times10^{-4}$ for the o-QMSA spectrum of FIG. 4. It follows that the corresponding integrated densities and mobilities may be considered a better representation of the experimental data and are as follows $N_{s1}=1.66\times10^{12}$ cm$^{-2}$, $\mu_1$=4100 cm$^2$/Vs, $N_{s2}=1.99\times10^{12}$ cm$^{-2}$, $\mu_2$=570 cm$^2$/Vs. Since ghost holes are also observed in the BA spectrum and the MCF fit to the data, we conclude that the present invention represents a significant improvement over the previous approaches in terms of eliminating ghost carriers and extracting real carrier densities and mobilities. In general, i-QMSA spectra tend to have considerably fewer unphysical secondary features than o-QMSA spectra for the same data set, whereas primary features are typically quite similar for the two cases.

Figure 7:
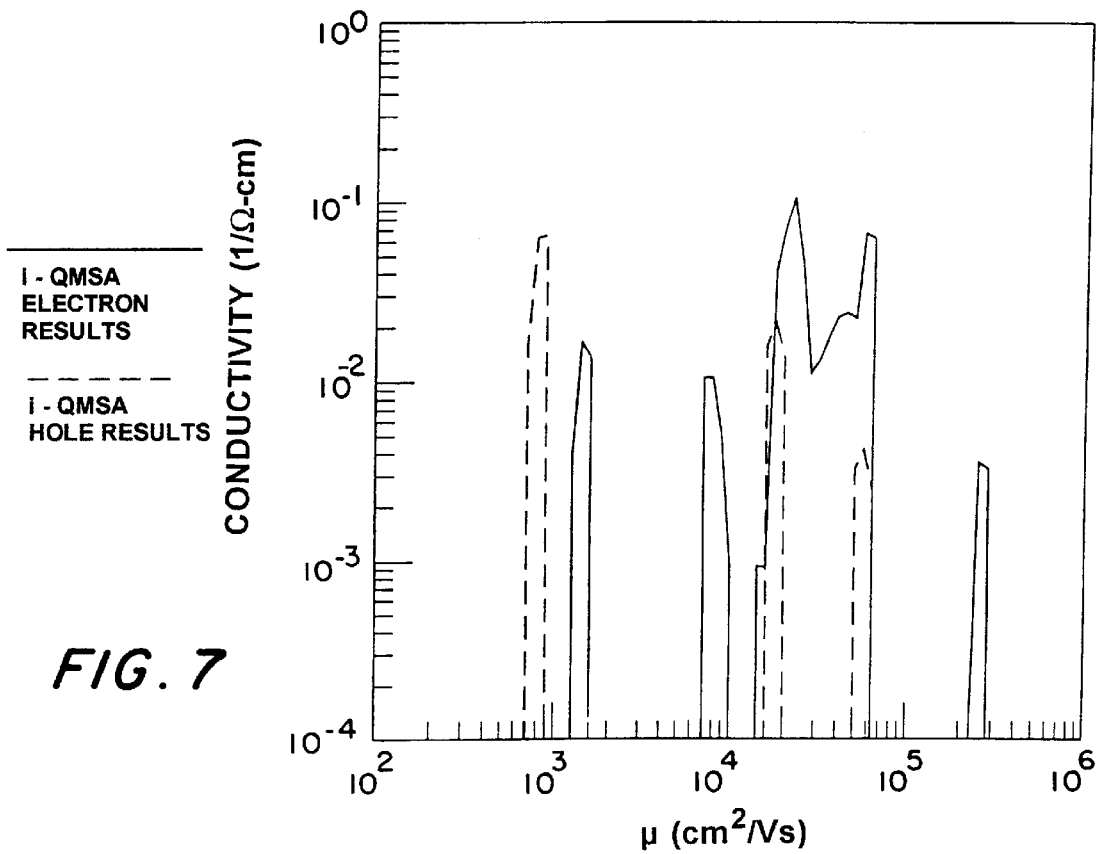
FIG. 7 is a plot of the results obtained from the present invention for a p-type $Hg_{1-x}Cd_xTe$ sample grown by liquid phase epitaxy obtained at T=70 K.

FIG. 7 illustrates the i-QMSA spectra obtained at T=70 K for a p-type $Hg_{1-x}Cd_xTe$ sample grown by liquid phase epitaxy. The broad electron feature is known to be a 2D carrier, most likely at the unpassivated surface, because at 1.6 K distinct Quantum Hall plateaus are observed with the oscillation frequency determines the existence of a thermally generated minority-carrier population whose density increases approximately exponentially in this temperature range ($1.6\times10^{11}$ cm$^{-3}$ at 70 K). However, the minority-carrier mobility of 260,000 cm$^2$/Vs is more accurate than the o-QMSA result of 460,000 cm$^2$/Vs (as is known from other evidence), and unlike the earlier procedure i-QMSA succeeded in extracting the presence of the minority carrier at the still lower temperature of 60 K. This is 20 K lower than the lowest temperatures at which the MCF and BA procedures were able to detect its presence.

Figure 8:
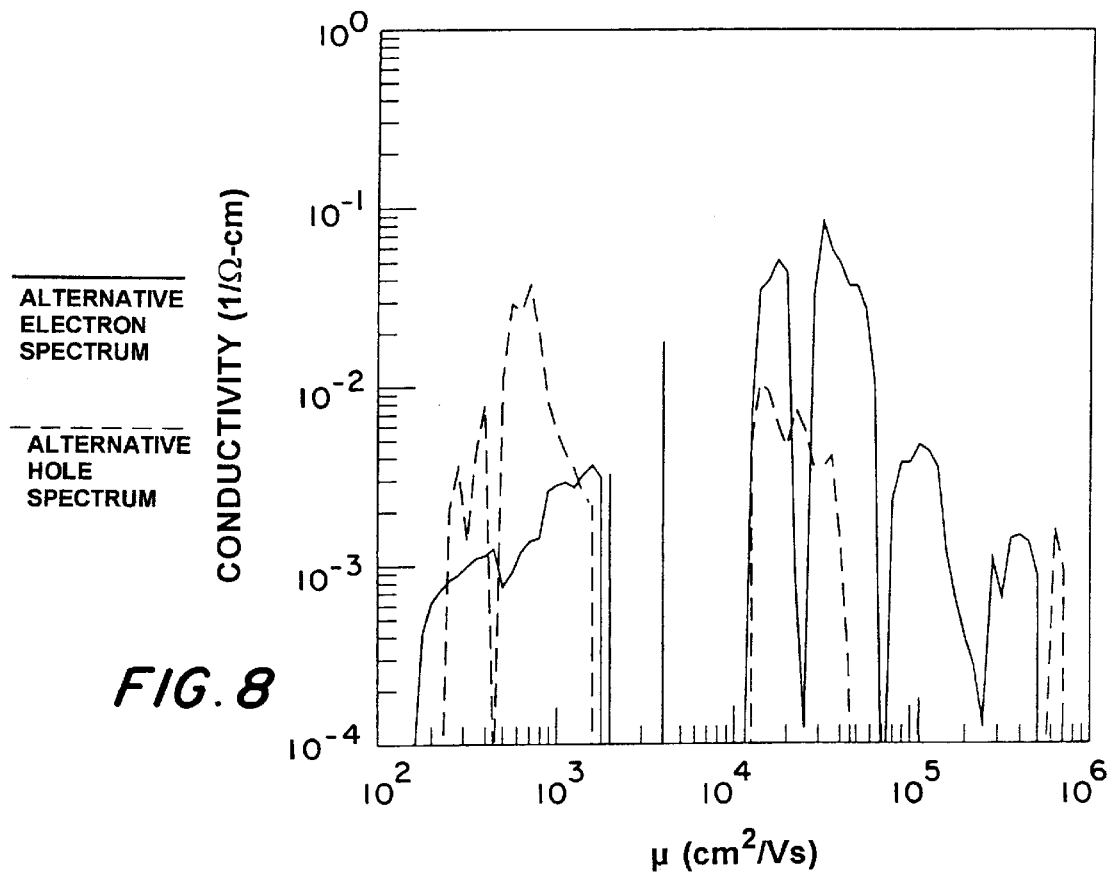
FIG. 8 is a plot of the results obtained from an alternative method, showing the introduction of spurious features.

Although in this case the error of i-QMSA ($\chi^2=1\times10^{-5}$) is again significantly better than that of o-QMSA ($\chi^2=3\times10^{-4}$), it is important to note that there in fact exist a large number of distinct alternative spectra that yield approximately the same error. This is a consequence of the significant overdetermination of the mathematical problem. In FIG. 8, we shown one such spectrum, which has an error ($\chi^2=1.5\times10^{-5}$) only slightly higher than the i-QMSA result, but which introduces many spurious features and does not provide a meaningful carrier density and average mobility for the thermally generated minority electron. Extensive testing has led to the conclusion that the i-QMSA algorithm of this invention systematically avoids physically unreasonable spectra while at the same time providing excellent fits to the data.

Figure 9:
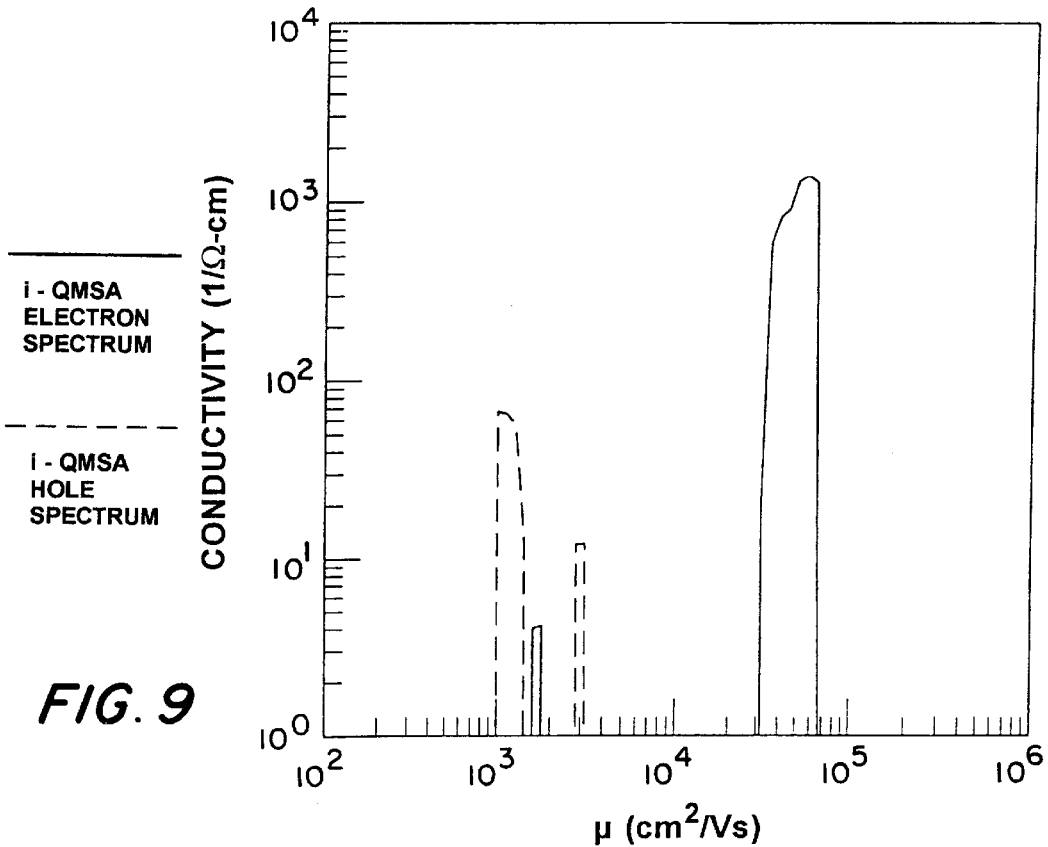
FIG. 9 is a plot of the results obtained from the present invention for a semimetallic 150 Å InAs-GaSb single quantum well grown by MBE, at T=200 K.

FIG. 9 illustrates the i-QMSA spectra at T=200 K for a semimetallic 150 Å InAs-GaSb single quantum well grown by MBE. While o-QMSA introduced a number of minor electron peaks and hole ghosts close to the majority electron, the present invention elminates those and also improves the fit by almost an order of magnitude. Furthermore, while o-QMSA generated a rather narrow primary electron feature, the improved linewidth sensitivity of i-QMSA makes it possible to determine that the electrons have a range of mobilities between $3\times10^4$ and $7\times10^4$ cm$^2$/Vs. The two hole features are 2 D carriers adjacent to the InAs QW and 3 D carriers occupying a thick GaSb buffer layer, while the low-mobility electron feature is a ghost.

Anisotropic Case Example

Figure 10:
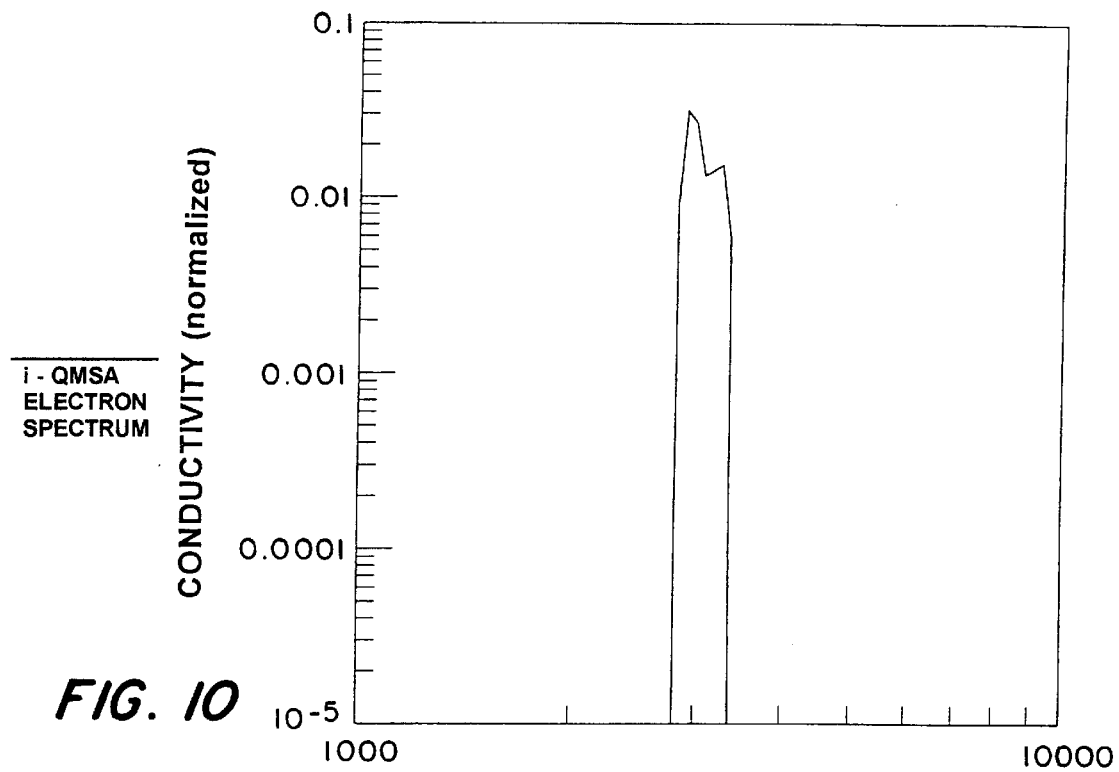
FIG. 10 is a plot of the results obtained from the present invention for a bulk Si furnace-annealed sample, assuming anisotropic conductivity.
Figure 11:
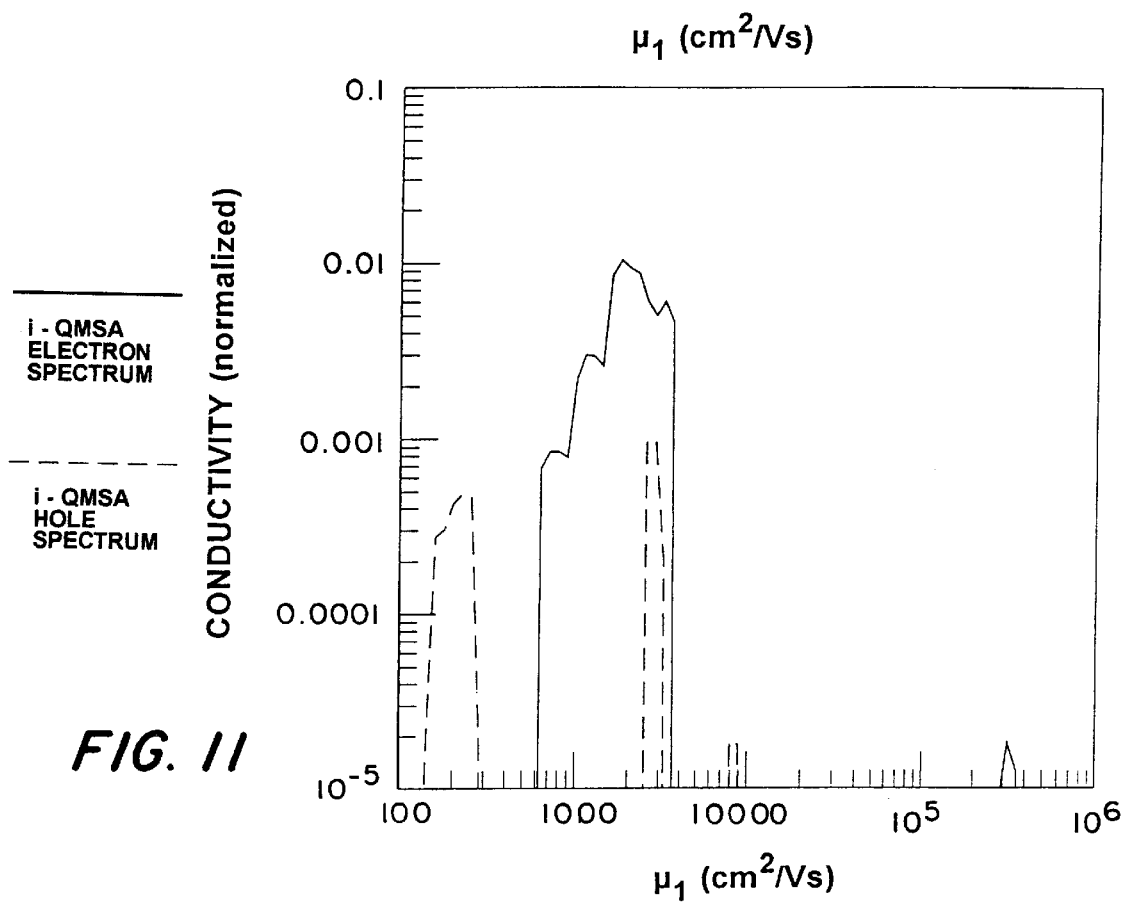
FIG. 11 shows the results of assuming isotropic conduction.

The anisotropic i-QMSA procedure was also applied to a bulk Si furnace-annealed sample that was n-doped with phosphorous. In that case, the following parameters have been used: $R_p$=1 (holes in the isotropic Γ valley), $R_n$=6.7 (electrons in the anisotropic X valleys), and C=⅔. The mobility spectrum at T=296 K is shown in FIG. 10 as a function of the larger mobility ($\mu_1$). The electrons are given by the solid line, while holes are correctly absent from the i-QMSA output. The electron density and average mobility are $2.4\times10^{14}$ cm$^{-3}$ and 2100 cm$^2$/Vs, respectively. On the other hand, FIG. 11 shows the results of assuming isotropic conduction. There is, now a prominent ghost hole and also a low mobility hole feature present (shown by the dashed lines); however, in reality the sample should not contain any hole carriers. These minority-carrier artifacts are known to severely distort the majority carrier species (in this case, overestimating the carrier density by 54%).

Figure 12:
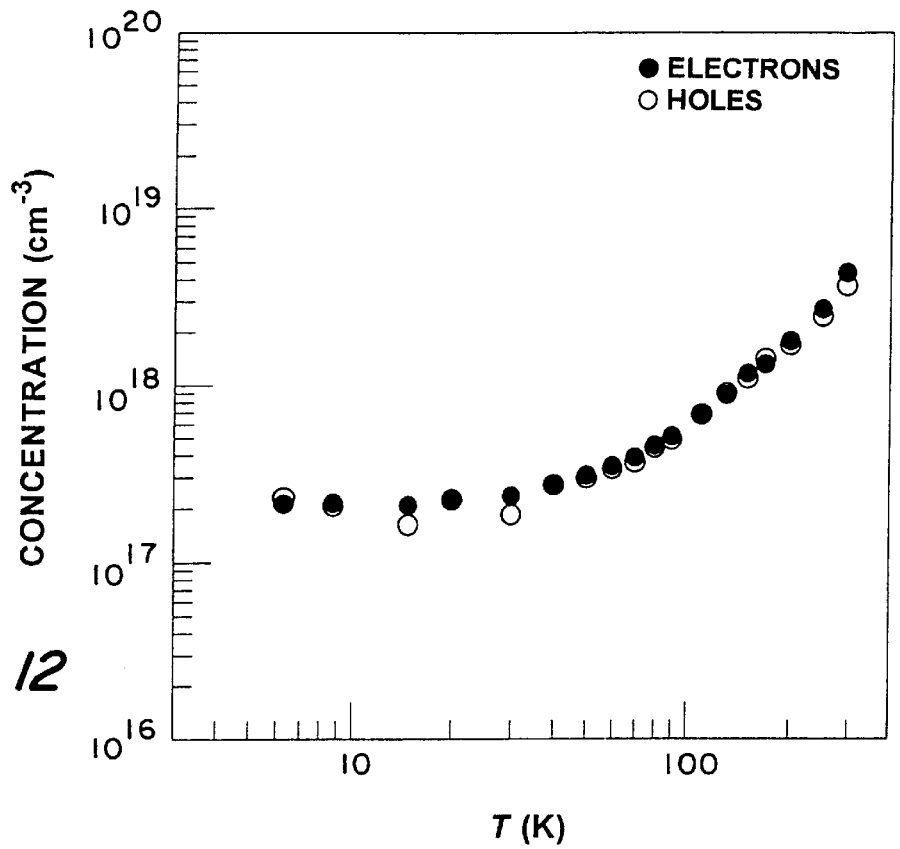
FIG. 12 shows the results of Hall measurements on a 5000 Å Bi thin film grown on (111)B CdTe substrates by molecular beam epitaxy.
Figure 13:
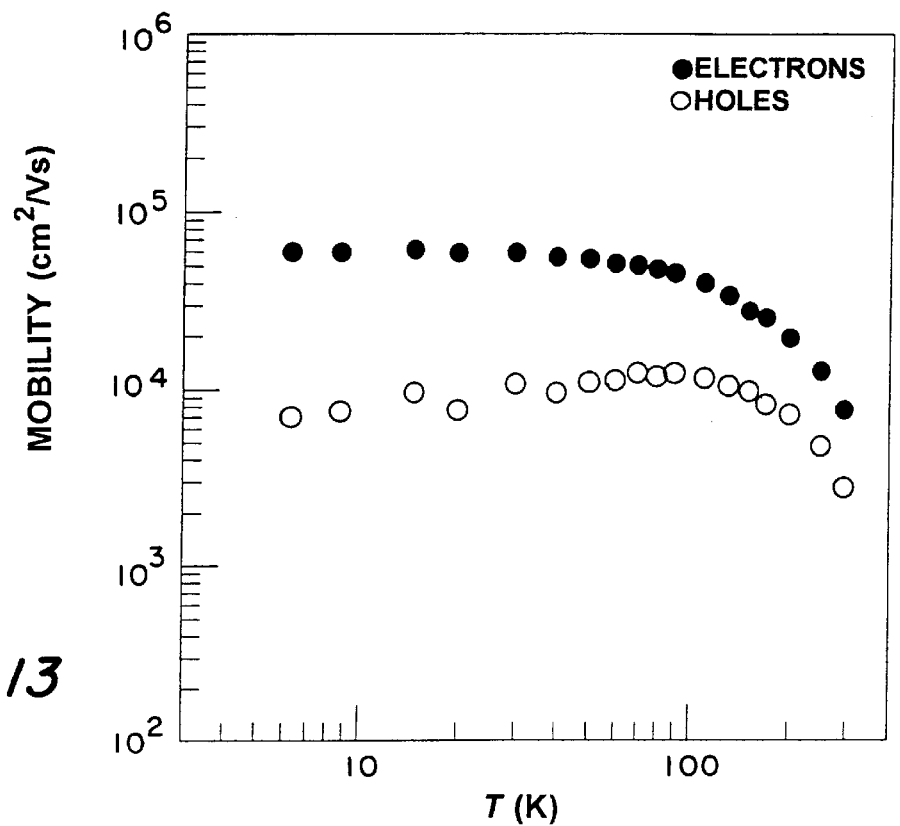
FIG. 13 shows average electron and hole mobilities obtained using the anisotropic i-QMSA procedure.

The anisotropic i-QMSA algorithm has also been applied to the analysis of actual Hall measurements on a 5000 Å Bi thin film grown on (111)B CdTe substrates by molecular beam epitaxy. In the measurements, the magnetic field was aligned with the trigonal axis in bismuth, and the current flow was in the plane normal to that axis. Therefore, as input parameters, we used C=1, $R_p$=1 (isotropic holes in the T valley), and $R_n$=60 to model the anisotropic conduction of electrons in the L valleys. Results for the carrier densities as a function of temperature are shown in FIG. 12. Comparison with statistical calculations based on non-parabolic bands with ellipsoidal Fermi surfaces yields a satisfactory agreement over the entire temperature range. On the other hand, if an isotropic i-QMSA calculation is performed, the carrier densities are significantly higher at both low and high temperatures (e.g., $5\times10^{17}$ cm$^{-3}$ compared with $2\times10^{17}$ cm$^{-3}$ at 6.3 K). The average electron and hole mobilities obtained using the anisotropic i-QMSA procedure are shown in FIG. 13. At T=6.3 K, the electron mobility is found to be $6.4\times10^4$ cm$^2$/Vs, while the hole mobility is 6600 cm$^2$/Vs. On the other hand, the incorrect assumption of isotropic conduction leads to the erroneous result that the electron and hole mobilities are nearly equal.

Therefore, the discussed extension to the i-QMSA algorithm can be employed to treat the cases of anisotropic conduction in L and X valleys of a wide range of semiconductor and semimetal materials, for which any mobility spectrum approach reported previously cannot produce reliable results. The algorithm is straightforwardly generalized to treat both isotropic and anisotropic carriers of the same type provided these carrier species have different mobilities.

Obviously, many modifications and variations of the present invention are possible in light of the above teachings. It is therefore to be understood that, within the scope of the appended claims, the invention may be practiced otherwise than as specifically described.

What is claimed is:

1. A method for determining a carrier conductivity-carrier mobility spectrum for a semiconductor sample, comprising the steps:

sequentially exposing said semiconductor sample to a plurality K of preselected magnetic fields $B_k$, k=1, 2, . . . K;

for each of a plurality J of values of magnetic fields $B_j$, j=1, 2, . . . J, wherein the set of all $B_j$ includes at least all $B_k$, obtaining a Hall coefficient $R_H(B_j)$ and a resistivity $\rho(B_j)$;

for each said $B_j$, calculating from said $R_H(B_j)$ and $\rho(B_j)$ experimental conductivity tensor components $\sigma_{xx}^j$(exp) and $\sigma_{xy}^j$(exp), and slopes of said conductivity tensor components $\sigma'_{xx}^j$(exp) and $\sigma'_{xy}^j$(exp);

selecting a trial carrier conductivity-carrier mobility spectrum $s_i$ corresponding to a plurality I of carrier mobilities $\mu_i$, i=1, 2, . . . I;

for each said $B_j$, using said trial carrier conductivity-carrier mobility spectrum to calculate conductivity tensor components $\sigma_{xx}^j$ and $\sigma_{xy}^j$, and slopes of said conductivity tensor components $\sigma'_{xx}^j$ and $\sigma'_{xy}^j$;

for each said $B_j$, calculating errors $\Delta_{xx}^j \equiv \sigma_{xx}^j(\exp)-\sigma_{xx}^j$, $\Delta_{xy}^j \equiv \sigma_{xy}^j(\exp)-\sigma_{xy}^j$, $\Delta'_{xx}^j \equiv \sigma'_{xx}^j(\exp)-\sigma'_{xx}^j$, and $\Delta'_{xy}^j \equiv \sigma'_{xy}^j(\exp)-\sigma'_{xy}^j$, and calculating therefrom a total weighted squared error $\chi_j^2$;

for each said $B_j$ and at least a subset of said $\mu_i$, calculating an optimum change to said trial carrier conductivity-carrier mobility spectrum $\delta s_{ij}$, and calculating therefrom a modified total weighted squared error $\chi_{ij}^2$;

for each said $B_j$, determining a minimum carrier mobility point $\mu_{imin,j}$ corresponding to a mobility point whose change $\delta s_{ij}$ yields the lowest weighted squared error $\chi_{ij}^2$; and for each said $B_j$ and at least a subset of said $\mu_i$, changing said carrier conductivity-carrier mobility spectrum point $s_i$ by not more than $\delta s_{ij}$.

2. The method of claim 1, wherein said step of obtaining a Hall coefficient $R_H(B_j)$ and a resistivity $\rho(B_j)$ for each of said magnetic field values $B_j$ comprises:

for each $B_k$, using said measured Hall coefficient $R_H(B_k)$ and resistivity $\rho(B_k)$ as said obtained Hall coefficient $R_H(B_j)$ and resistivity $\rho(B_j)$; and for all other $B_j$, interpolating between or extrapolating from said measured Hall coefficients $R_H(B_k)$ and resistivities $\rho(B_k)$ to obtain said obtained Hall coefficient $R_H(B_j)$ and resistivity $\rho(B_j)$.

3. A method for determining a carrier conductivity-carrier mobility spectrum for a semiconductor sample, comprising the steps:

(a) sequentially exposing said semiconductor sample to a plurality K of preselected magnetic fields $B_k$, k=1, 2, . . . K;

(b) for each of a plurality J of values of magnetic fields $B_j$, j=1, 2, . . . J, wherein the set of all $B_j$ includes at least all $B_k$, obtaining a Hall coefficient $R_H(B_j)$ and a resistivity $\rho(B_j)$;

(c) for each said $B_j$, calculating from said $R_H(B_j)$ and $\rho(B_j)$ experimental conductivity tensor components $\sigma_{xx}^j$(exp) and $\sigma_{xy}^j$(exp), and slopes of said conductivity tensor components $\sigma'_{xx}^j$(exp) and $\sigma'_{xy}^j$(exp);

(d) selecting a trial carrier conductivity-carrier mobility spectrum $s_i$ corresponding to a plurality I of carrier mobilities $\mu_i$, i=1, 2, . . . I;

(e) for each said $B_j$, using said trial carrier conductivity-carrier mobility spectrum to calculate conductivity tensor components $\sigma_{xx}^j$ and $\sigma_{xy}^j$, and slopes of said conductivity tensor components $\sigma'_{xx}^j$ and $\sigma'_{xy}^j$;

(f) for each $B_j$, calculating errors $\gamma_{xx=\sigma xx}^j(\exp)-\sigma_{xx}^j$, $\Delta_{xy}^j \equiv \sigma_{xy}^j(\exp)-\sigma_{xy}^j$, $\Delta'_{xx}^j \equiv \sigma'_{xx}^j(\exp)-\sigma'_{xx}^j$, and $\Delta'_{xy}^j \equiv \sigma'_{xy}^j(\exp)-\sigma'_{xy}^j$, and calculating therefrom a total weighted squared error $\chi_j^2$;

(g) for each said $B_j$ and at least a subset of said $\mu_i$, calculating an optimum change to said trial carrier conductivity-carrier mobility spectrum $\delta s_{ij}$, and calculating therefrom a modified total weighted squared error $\chi_{ij}^2$;

(h) for each said $B_j$, determining a minimum carrier mobility point $\mu_{imin,j}$ corresponding to a mobility point whose change $\delta s_{ij}$ yields the lowest weighted squared error $\chi_{ij}^2$;

(i) for each said $B_j$ and at least a subset of said $\mu_i$, changing said carrier conductivity-carrier mobility spectrum point $s_i$ by not more than $\delta s_{ij}$, and (j) repeating steps (d) through (i) for a plurality of iterations n=1, 2, . . . N, wherein said changed conductivity-carrier mobility spectrum of step (i) for the nth iteration is selected as the trial carrier conductivity-carrier mobility spectrum of step (d) for the n+1)th iteration.

4. The method of claim 3, wherein said step of obtaining a Hall coefficient $R_H(B_j)$ and a resistivity $\rho(B_j)$ for each of said magnetic field values $B_j$ comprises:

for each $B_k$, using said measured Hall coefficient $R_H(B_k)$ and resistivity $\rho(B_k)$ as said obtained Hall coefficient $R_H(B_j)$ and resistivity $\rho(B_j)$; and for all other $B_j$, interpolating between or extrapolating from said measured Hall coefficients $R_H(B_k)$ and resistivities $\rho(B_k)$ to obtain said obtained Hall coefficient $R_H(B_j)$ and resistivity $\rho(B_j)$.

5. The method of claim 3, wherein said step (j) of repeating said steps (d) through (i) for a plurality of iterations comprises repeating said steps for at least a preselected minimum number of iterations and at most a preselected maximum number of iterations.

6. The method of claim 5, wherein said step (j) of repeating said steps (d) through (i) for a plurality of iterations comprises repeating said steps until some preselected condition is satisfied.

7. The method of claim 6, wherein said preselected condition is said total weighted squared error $\chi_{ij}^2$ not changing by more than a preselected amount over a preselected number of iterations.

8. The method of claim 3, wherein said trial carrier conductivity-carrier mobility spectrum is a Beck and Anderson mobility spectrum.

9. The method of claim 3, wherein $$\delta s_{ij} = \frac{F_{xx}^j \Delta_{xx}^j A_{xx}^{ij} + F_{xy}^j \Delta_{xy}^j A_{xy}^{ij} + F'_{xx}^j \Delta'_{xx}^j A'_{xx}^{ij} + F'_{xy}^j \Delta'_{xy}^j A'_{xy}^{ij}}{F_{xx}^j(A_{xx}^{ij})^2 + F_{xy}^j(A_{xy}^{ij})^2 + F'_{xx}^j(A'_{xx}^{ij})^2 + F'_{xy}^j(A'_{xy}^{ij})^2},$$

wherein $F_{xx}^j$, $F_{xy}^j$, $F'_{xx}^j$, $F'_{xy}^j$ are independently selected weighting factors between 0 and 1.

10. The method of claim 9, wherein $F_{xx}^j = F_{xy}^j = F'_{xx}^j = F'_{xy}^j = 1$.

11. The method of claim 3, wherein said step of, for at least a subset of said $\mu_i$, changing said carrier conductivity-carrier mobility spectrum by not more than $\delta s_{ij}$ comprises changing said spectrum for values of $\mu_i$ only wherein $(\mu B)_{min} \leq \mu_{imin,j} B_j \leq (\mu B)_{max}$, wherein $(\mu B)_{min}$ and $(\mu B)_{max}$ are preselected parameters.

12. The method of claim 3, wherein for the case where one or more of the carriers has an anisotropic mobility, wherein said step of, for at least a subset of said $\mu_i$, changing said carrier conductivity-carrier mobility spectrum by not more than $\delta s_{ij}$ comprises changing said spectrum for values of $\mu_i$ only wherein $(\mu B)_{min}[(1+C(\sqrt{R}-1))] \leq \mu_{imin,j} B_j \leq (\mu B)_{max}$ $(1+C(\sqrt{R}-1))$, wherein $(\mu B)_{min}$ and $(\mu B)_{max}$ are preselected parameters, C is a weight factor for the contributions of different mobility symmetry axes, and R is the mobility anisotropy ratio for the dominant carrier species.

13. The method of claim 11, wherein $(\mu B)_{min}$ is about 0.5 for $B_j$<about 0.4 $B_{max}^{exp}$ and $(\mu B)_{min}$ is about $\mu_{min}B_j$, wherein $\mu_{min}$ is the lowest mobility in the spectrum, for $B_j$>about 0.4 $B_{max}^{exp}$, and wherein $(\mu B)_{max}$=about 2.1–1.6/$(1+\mu_{max}^2 B_j^2)$, wherein $\mu_{max}$ is the highest mobility in the spectrum.

14. The method of claim 11, wherein for a given step $(\mu B)_{min}$ falls within either of the ranges $\mu_{imin,j}B_j<(\mu B)'_{min}$ or $\mu_{imin,j}B_j>(\mu B)'_{max}$, wherein $(\mu B)'_{min}$ and $(\mu B)'_{max}$ are preselected parameters, changing said carrier conductivity-carrier mobility spectrum by not more than $\delta s_{ij}$ comprises changing said spectrum with respect to both hole densities and electron densities, according to:

$$\delta s_i^n = \Delta_{xx}^j - \Delta_{xy}^j,$$
$$\delta s_i^p = \Delta_{xx}^j + \Delta_{xy}^j,$$

where n and p denote electron and hole mobility points, respectively.

15. The method of claim 11, wherein for the case where one or more of the carriers has an isotropic mobility, for a given step $(\mu B)_{min}$ falls within either of the ranges $\mu_{imin,j}B_j<(\mu B)'_{min}$ or $\mu_{imin,j}B_j>(\mu B)'_{max}$, wherein $(\mu B)'_{min}$ and $(\mu B)'_{max}$ are preselected parameters, changing said carrier conductivity-carrier mobility spectrum by not more than $\delta s_{ij}$ comprises changing said spectrum with respect to both hole densities and electron densities, according to:

$$\delta s_i^n = \frac{\Delta_{xx}^j - a_{12}\delta s_i^p}{a_{11}},$$

$$a_{11} = \frac{C(1+R_n)}{4} + (1-C)\frac{R_n}{1+R_n},$$

$$a_{12} = \frac{C(1+R_p)}{4} + (1-C)\frac{R_p}{1+R_p},$$

$$a_{21} = \frac{-C\sqrt{R_n} + (1-C)2R_n/(1+R_n)}{2},$$

$$a_{22} = \frac{-C\sqrt{R_p} + (1-C)2R_p/(1+R_p)}{2}.$$

wherein n and p denote electron and hole mobility points, respectively and $R_n$ and $R_p$ are the electron and hole mobility anisotropy ratios, respectively.

16. The method of claim 11, wherein, for a given $\mu_i$, only one change to the carrier conductivity-carrier mobility spectrum by not more than $\delta s_{ij}$ is performed, corresponding to the field making the highest contribution to the net error, $$\chi^2 = \sum_j \chi_j^2.$$

17. The method of claim 3, further comprising the step of: changing the carrier conductivity-carrier mobility spectrum by $\Delta s_{imin}$, wherein $\Delta s_{imin,j} = \omega f_c \chi_j^2 |\chi^2 \delta s_{imin,j}$, wherein $\omega$ is a convergence weight factor between 0 and 1 and $f_c$ is a scaling factor, and $\Delta s_{imin,j} \leq \delta s_{imin,j}$.

18. The method of claim 17, wherein said $\omega$ is about 0.1.

19. The method of claim 17, wherein said $f_c$ is about 1.

20. The method of claim 17,
wherein, for $\Delta s_{imin,j} > 0$, said $f_c$ is about $(s_{max}^- + s_{max}^+)/2s_{imin}$, wherein $s_{max}^-$ is the largest $s_i$ in the spectrum within a factor of about 1.8 lower than $\mu_{imin,j}$ and $s_{max}^{30}$ is the largest $s_i$ in the spectrum within a factor of about 1.8 higher than $\mu_{imin,j}$, and further wherein $f_c \leq$ about 10; and wherein, for $\Delta s_{imin,j} < 0$, said $f_c$ is about $2s_{imin,j}/(s_{max}^- + s_{max}^{30})$, and further wherein $f_c \geq$ about 0.1.

21. The method of claim 3, wherein said step of, for each $B_j$ and at least a subset of said $\mu_i$, changing said carrier conductivity-carrier mobility spectrum by not more than $\delta s_{ij}$, comprises changing said spectrum for only $\mu_i = \mu_{imin,j}$.

22. The method of claim 3, wherein said step of, for each $B_j$ and at least a subset of said $\mu_i$, changing said carrier conductivity-carrier mobility spectrum by not more than $\delta s_{ij}$, comprises changing said spectrum for $\mu_i$ where the improvement $\Delta\chi_{ij}^2 \equiv \chi_j^2 - \chi_{ij}^2$ is within a preselected amount of the maximum value for $\Delta\chi_{ij}^2$.

23. The method of claim 22, wherein said preselected amount is between about 25% and about 35% of the maximum value for $\Delta\chi_{ij}^2$.

24. The method of claim 6, wherein said method further comprises the step of, after some plurality of iterations, transferring a conductivity of amount $\Delta s_{swap}$ between two points on said carrier conductivity-carrier mobility spectrum, wherein said switch has the effect of reducing $\chi_{ij}^2$.

25. The method of claim 24, wherein said step of transferring conductivity between said two consecutive points on said carrier conductivity-carrier mobility spectrum is conducted only for such two points wherein the spectrum is no less smooth after said transferring than before said transferring.

26. The method of claim 6, wherein said method further comprises the step of, after some plurality of iterations, transferring conductivity between three consecutive points on said carrier conductivity-carrier mobility spectrum by changing a first point and a third point by $\Delta s/2$, and by changing a second point by $-\Delta s$, wherein said $$\Delta s = \frac{s_1/2 + 2s_2 + s_3/2 \pm \sqrt{(s_1/2 + 2s_2 + s_3)^2 - 3(s_2^2 - s_1 s_3)}}{2(s_2^2 - s_1 s_3)}.$$

27. The method of claim 26, wherein said step of transferring conductivity between said three consecutive points on said carrier conductivity-carrier mobility spectrum is conducted only for such three consecutive points wherein all three points have nonzero magnitudes, and wherein no new peaks in said carrier conductivity-carrier mobility spectrum are created by said transferring.

28. The method of claim 6, wherein said method further comprises the step of, for points on said carrier conductivity-carrier mobility spectrum wherein the conductivity at said point is at least a threshold amount, and wherein decreasing the conductivity at said point by a predetermined amount $\Delta s_i$ will decrease $\chi^2$, decreasing said conductivity at said points by $\Delta 2_i$.

29. The method of claim 28, wherein $\Delta s_i$ is between about $0.05s_i$ and $0.2s_i$.

30. The method of claim 24, wherein said step of transferring is conducted after at least a preselected number of iterations.

31. The method of claim 30, wherein said step of transferring is repeated after at least a preselected number of iterations.

32. The method of claim 31, wherein said step of transferring is repeated after a preselected number of iterations between about 50 and about 200.

33. The method of claim 26, is conducted after at least a preselected number of iterations.

34. The method of claim 3, further comprising the step (i) the step of:

multiplying at least a subset of said conductivities by $$\omega_r \left[ \sigma_{xx}^{exp}(B=0) - \sum_i s_i \right],$$

wherein $\omega_r$ is a preselected relaxation rate and $\sigma_{xx}^{exp}(B=0)$ is the measured $\sigma_{xx}$ at zero applied field.

35. A method for determining a Hall factor $r_H$ for a semiconductor sample from a carrier conductivity-carrier mobility spectrum, comprising the steps:

determining a carrier conductivity-carrier mobility spectrum for a discrete number of points i=1, 2, . . . I $\sigma_i(\mu_i)$; and determining said $r_H$ according to $$r_H = \frac{\left( \sum_i \sigma_i \mu_i \right)}{\left( \sum_i \sigma_i \right)^2 \bigg/ \left( \sum_i \sigma_i / \mu_i \right)}.$$

* * * * *